United States Patent
Parry et al.

(10) Patent No.: US 11,755,237 B2
(45) Date of Patent: Sep. 12, 2023

(54) OVERWRITING AT A MEMORY SYSTEM

(71) Applicant: Micron Technology, Inc., Boise, ID (US)

(72) Inventors: Jonathan S. Parry, Boise, ID (US); Giuseppe Cariello, Boise, ID (US); Reshmi Basu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/462,228

(22) Filed: Aug. 31, 2021

(65) Prior Publication Data

US 2023/0069603 A1    Mar. 2, 2023

(51) Int. Cl.
  *G06F 3/06* (2006.01)

(52) U.S. Cl.
  CPC .......... *G06F 3/0655* (2013.01); *G06F 3/0604* (2013.01); *G06F 3/0679* (2013.01)

(58) Field of Classification Search
  CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16;
  (Continued)

(56) References Cited

U.S. PATENT DOCUMENTS

| | | | |
|---|---|---|---|
| 7,487,303 B2 * | 2/2009 | Song ..................... | G06F 3/0679 711/205 |
| 8,122,193 B2 * | 2/2012 | Song ..................... | G06F 3/0679 711/144 |

(Continued)

FOREIGN PATENT DOCUMENTS

CN    114550790 A  *  5/2022  ......... G11C 13/0004

OTHER PUBLICATIONS

Ashok K. Sharma, "Advanced Nonvolatile Memory Designs and Technologies," in Advanced Semiconductor Memories: Architectures, Designs, and Applications, IEEE, 2003, pp. 319-477, doi: 10.1109/9780470544136.ch5. (Year: 2003).*

R. Micheloni, M. Picca, S. Amato, H. Schwalm, M. Schepplerand S. Commodaro, "Non-Volatile Memories for Removable Media," in Proceedings of the IEEE, vol. 97, No. 1, pp. 148-160, Jan. 2009, doi: 10.1109/JPROC.2008.2007477. (Year: 2009).*

F. Margaglia and A. Brinkmann, "Improving MLC flash performance and endurance with extended P/E cycles," 2015 31st Symposium on Mass Storage Systems and Technologies (MSST), Santa Clara, CA, USA, 2015, pp. 1-12, doi: 10.1109/MSST.2015.7208278. (Year: 2015).*

(Continued)

*Primary Examiner* — Daniel C. Chappell
(74) *Attorney, Agent, or Firm* — Holland & Hart LLP

(57) ABSTRACT

Methods, systems, and devices for overwriting at a memory system are described. A memory system may be configured to overwrite portions of a memory array with new data, which may be associated with omitting an erase operation. For example, write operations may be performed in accordance with a first demarcation configuration to store information at a portion of a memory array. A portion of a memory system may then determine to overwrite the portion of the memory array with different or updated information, which may include performing write operations in accordance with a second demarcation configuration. The second demarcation configuration may be associated with different cell characteristics for a one or more logic states, such as different distributions of stored charge or other cell property, different demarcation characteristics, different write operations, among other differences, which may support performing an overwrite operation without first performing an erase operation.

25 Claims, 13 Drawing Sheets

(58) Field of Classification Search
CPC ... G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 8,407,400 | B2* | 3/2013 | Marotta | G11C 16/16 |
| | | | | 711/103 |
| 9,116,793 | B2* | 8/2015 | Kandiraju | G06F 12/1009 |
| 9,122,584 | B2* | 9/2015 | Kandiraju | G06F 16/1847 |
| 9,123,422 | B2* | 9/2015 | Yu | G11C 16/10 |
| 9,298,603 | B2* | 3/2016 | Schuette | G06F 12/0246 |
| 9,348,749 | B2* | 5/2016 | Choi | G06F 3/0688 |
| 9,569,120 | B2* | 2/2017 | Ryan | G11C 16/26 |
| 9,606,737 | B2* | 3/2017 | Kankani | G06F 3/0629 |
| 9,639,282 | B2* | 5/2017 | Kankani | G06F 3/0688 |
| 9,940,040 | B2* | 4/2018 | Schnarch | G06F 3/0652 |
| 9,941,007 | B2* | 4/2018 | Peddle | G06F 3/0679 |
| 10,229,735 | B1* | 3/2019 | Natarajan | G06F 12/0646 |
| 10,573,394 | B2* | 2/2020 | Pan | G11C 11/5642 |
| 10,719,438 | B2* | 7/2020 | Choi | G06F 3/064 |
| 2007/0061504 | A1* | 3/2007 | Lee | G11C 16/102 |
| | | | | 711/103 |
| 2010/0306580 | A1* | 12/2010 | McKean | G06F 12/0246 |
| | | | | 711/E12.001 |
| 2012/0191900 | A1* | 7/2012 | Kunimatsu | G06F 3/0638 |
| | | | | 711/E12.008 |
| 2014/0006688 | A1* | 1/2014 | Yu | G11C 16/10 |
| | | | | 365/185.03 |
| 2015/0364199 | A1* | 12/2015 | Kang | H01L 27/10823 |
| | | | | 365/185.11 |
| 2016/0162185 | A1* | 6/2016 | D'Abreu | G11C 13/0069 |
| | | | | 711/103 |
| 2016/0342345 | A1* | 11/2016 | Kankani | G06F 3/0634 |
| 2019/0066736 | A1* | 2/2019 | Stichka | G11C 16/10 |
| 2020/0073795 | A1* | 3/2020 | Asano | G06F 3/0656 |
| 2021/0064249 | A1* | 3/2021 | Mehta | G06F 11/1048 |
| 2022/0230681 | A1* | 7/2022 | Khwa | G11C 13/0061 |

OTHER PUBLICATIONS

T. Yang, H. Wu and W. Sun, "GD-FTL: Improving the Performance and Lifetime of TLC SSD by Downgrading Worn-out Blocks," 2018 IEEE 37th International Performance Computing and Communications Conference (IPCCC), Orlando, FL, USA, 2018, pp. 1-8, doi: 10.1109/PCCC.2018.8710996. (Year: 2018).*

N.-Y. Ahn and D. H. Lee, "Schemes for Privacy Data Destruction in a NAND Flash Memory," in IEEE Access, vol. 7, pp. 181305-181313, 2019, doi: 10.1109/ACCESS.2019.2958628. (Year: 2019).*

* cited by examiner

OVERWRITING AT A MEMORY SYSTEM

FIELD OF TECHNOLOGY

The following relates generally to one or more systems for memory and more specifically to overwriting at a memory system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
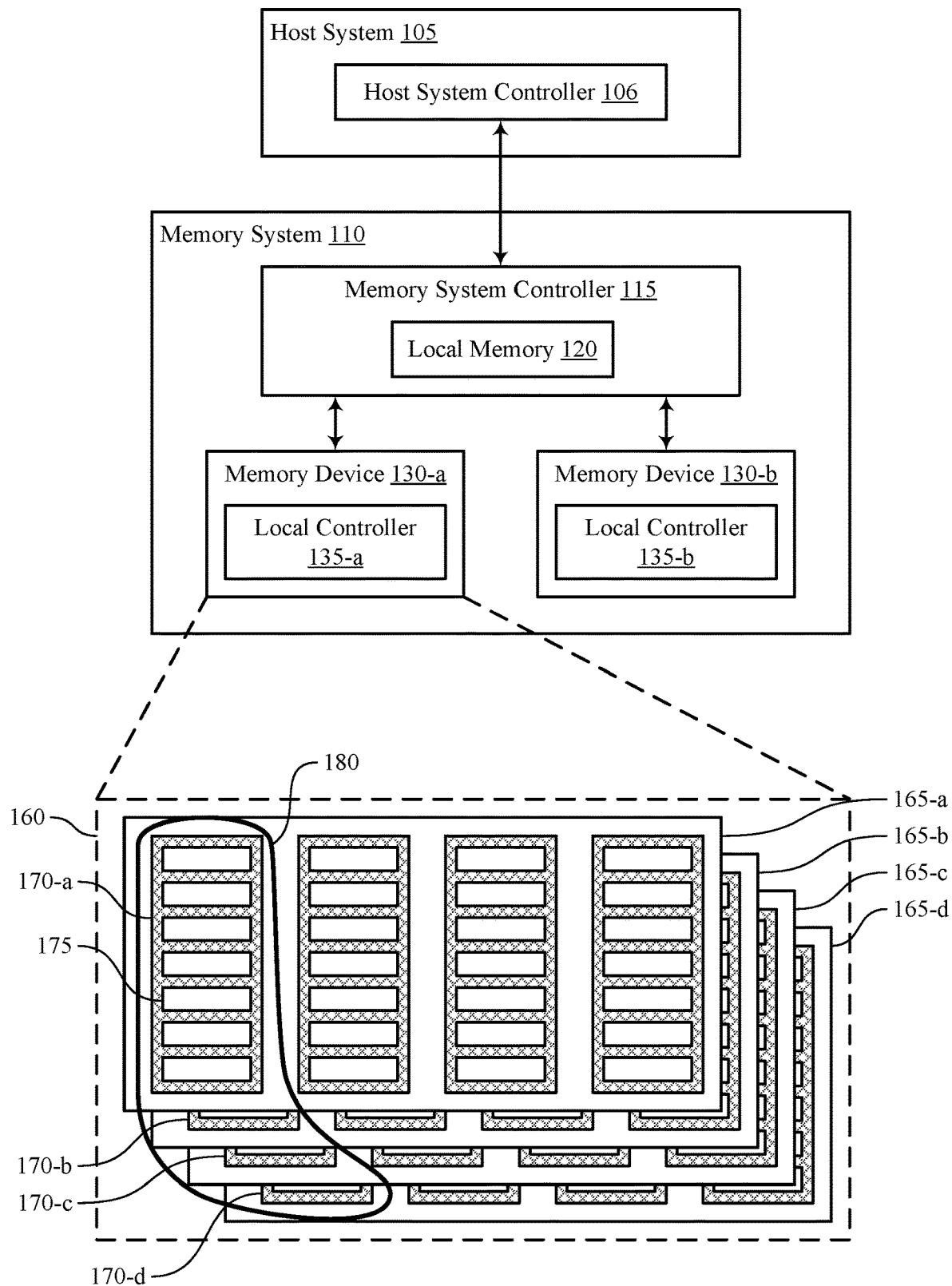
FIG. 1 illustrates an example of a system that supports overwriting at a memory system in accordance with examples as disclosed herein.

A memory system may include one or more memory devices that operate in accordance with various storage architectures. Memory devices may include arrays of memory cells and circuitry operable to perform access operations on the memory cells. In some storage architectures, memory cells of a memory device may be written to store a particular logic state, and may be erased before being written to store a different logic state or to otherwise store different information. For example, in a NAND memory architecture, a NAND memory cell may be written by storing a charge on a floating gate of a transistor, which may affect a threshold voltage for activating the memory cell, or may affect an amount of current that flows through the transistor when the transistor is activated, which may be sensed for detecting a logic state stored by the memory cell. In some cases, some portions of data written into a memory array may be temporary (e.g., may become invalid after some time). In some examples, to write a portion of a NAND memory array with different information, the portion of the NAND memory array may first be erased by removing or otherwise changing the amount of charge stored on the floating gates of the transistors of the portion of the NAND memory array. However, in these and other examples, erasing memory cells or otherwise changing a state (e.g., flipping bits of otherwise changing logic states) of memory cells may be associated with power consumption, latency, or memory cell degradation or wear, among other drawbacks.

In accordance with examples as disclosed herein, one or more components of a memory system may be configured to overwrite portions of a memory array with new data, which may be associated with omitting an erase operation (e.g., in accordance with a "reuse without erase" configuration). For example, a component of a memory system may perform write operations in accordance with a first demarcation (e.g., a first demarcation configuration, a first set of write signals associated with respective logic states, a first set of one or more reference signals for distinguishing between written logic states) to store information at a portion of a memory array. Following such write operations, the component of the memory system may determine to overwrite the portion of the memory array with different or updated information, which may include performing write operations in accordance with a second demarcation (e.g., a second demarcation configuration, a second set of write signals associated with respective logic states, a second set of one or more reference signals for distinguishing between written logic states). In some examples, a second demarcation may be associated with different cell characteristics for a given logic state, such as different distributions of stored charge or other cell property, different demarcation characteristics (e.g., different reference voltages), different write operations (e.g., different write voltages, different write currents), among other differences.

In some implementations, a component of the memory system may compare a new state to be stored at a memory cell (e.g., a desired logic state after overwrite) with a current state of a target memory cell to be written (e.g., a logic state associated with previously-written information). If the state of the target memory cell does not correspond to a new logic state, a component of the memory system may determine to overwrite the target memory cell with a new state in accordance with an overwrite demarcation configuration. If the state of the target memory cell does correspond to the new logic state, the component of the memory system may determine to refrain from performing an overwrite operation, which may further reduce power consumption or reduce memory cell fatigue compared to circumstances in which an overwrite operation is performed. In some examples, such techniques may be supported by demarcation configurations for overwrite being associated with an increased quantity of demarcations (e.g., an increased quantity of reference voltages), or an increased quantity of cell characteristic distributions for a respective quantity of logic states.

In some implementations, a memory system may overwrite a same portion of a memory array multiple times. At each overwriting pass, different portions of valid and invalid data may be overwritten or preserved, depending on the new information being written. A component of the memory system may store information related to an overwrite condition for one or more portions of a memory array, which may be used to identify a proper read demarcation for respective portions of the memory array, or to evaluate whether respective portions of the memory array are available for subsequent overwrite (e.g., are configured to support overwriting, are in a condition that supports a further overwrite operation), among other purposes. An overwriting scheme, as disclosed herein, may be implemented during garbage collection operations, for updating system tables (e.g., logical-to-physical (L2P) tables), for reusing Write Booster memory blocks, or for a number of other applications, including those applications where storage of information is relatively transient, or for portions of a memory array (e.g., subarrays, planes, blocks) that are configured for or allocated to storing relatively transient information (e.g., information that is relatively likely to change). In accordance with these and other examples, by overwriting memory cells with a write operation that selectively omits one or more aspects of erasing the associated memory cells, a memory system may operate with reduced memory degradation, reduced power consumption, or improved array availability, which may support longer operating life (e.g., a greater quantity of total bytes written (TBW), a greater program/erase endurance rating, or other measure of useful life), or a reduced degree of overprovisioning (e.g., a reduced quantity of spare memory cells that may be allocated for memory management such as garbage collection or for memory cell retirement), among other benefits.

Figure 2:
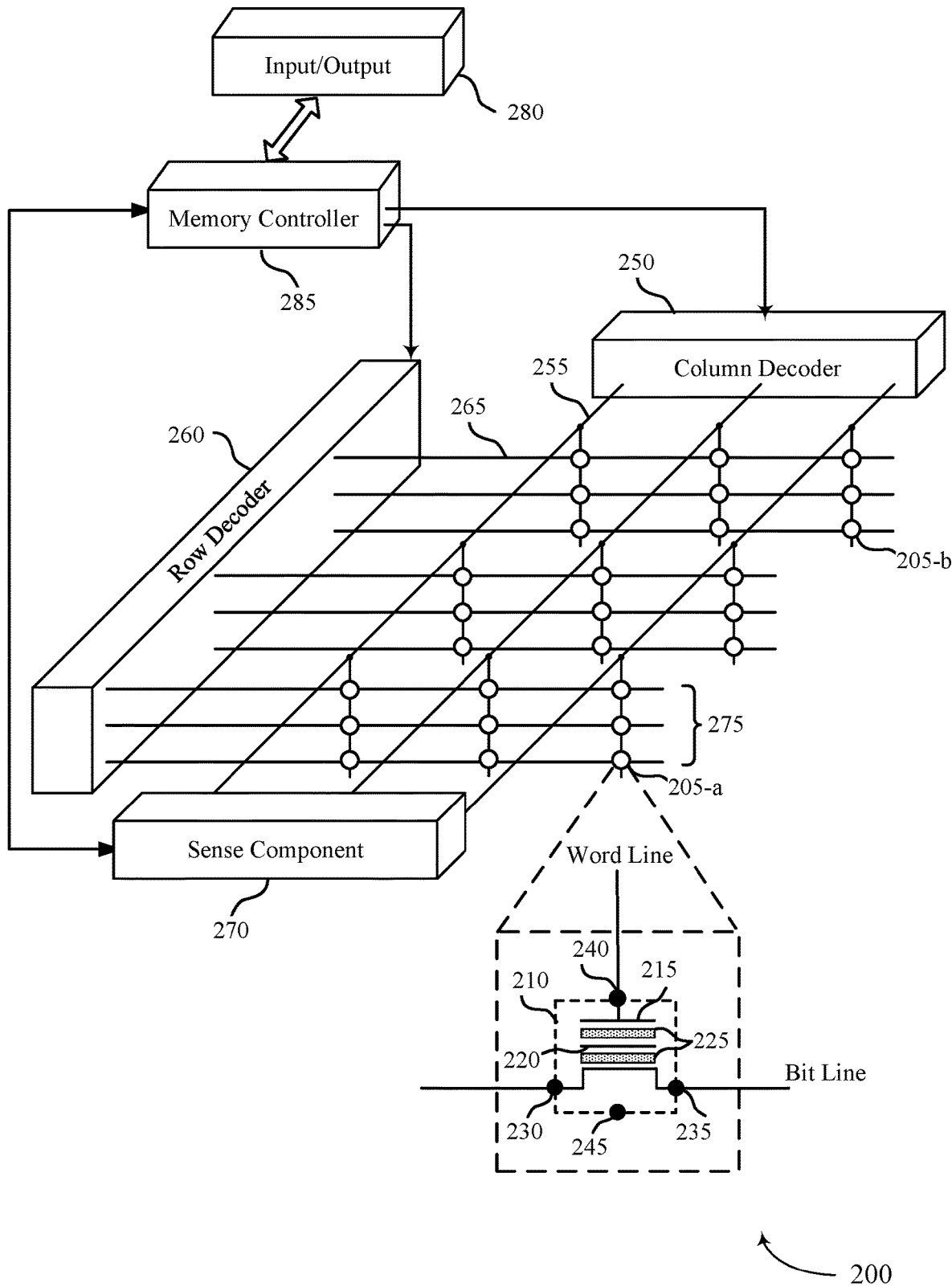
FIG. 2 illustrates an example of a memory device that supports overwriting at a memory system in accordance with examples as disclosed herein.
Figure 3:
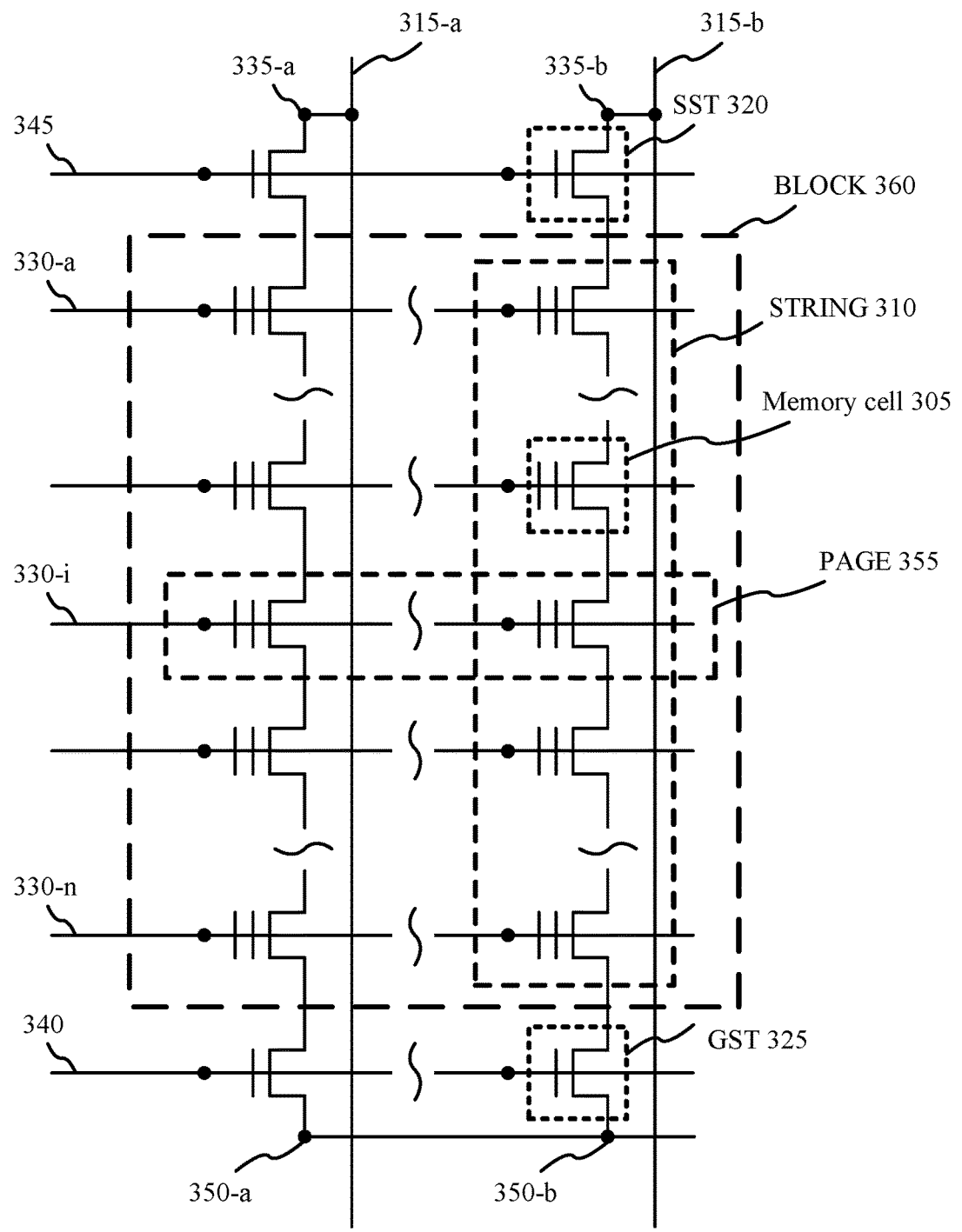
FIG. 3 illustrates an example of a memory circuit that supports overwriting at a memory system in accordance with examples as disclosed herein.

Features of the disclosure are initially described in the context of systems, devices, and circuits with reference to FIGS. 1 through 3. Features of the disclosure are described in the context of overwrite schemes, process flows, and an overwrite mapping with reference to FIGS. 4-7. These and other features of the disclosure are further illustrated by and described in the context of apparatus diagrams and flowcharts that relate to overwriting at a memory system with reference to FIGS. 8-13.

FIG. 1 illustrates an example of a system 100 that supports overwriting at a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller, a control component, or firmware configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, retirement operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller or firmware (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs).

Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165 c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, cell or sub-array retirement (e.g., retirement of blocks 170), or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support overwriting at a memory system. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In accordance with examples as disclosed herein, one or more components of the memory system 110 may be configured to support overwriting portions of a memory array (e.g., of a memory die 160) with new data, which may be associated with omitting an erase operation. For example, a component of a memory system 110 may perform write operations in accordance with a first demarcation configuration to store information at a portion of a memory array. Following such write operations, a component of the memory system 110 may determine to overwrite the portion of the memory array with different or updated information, which may include performing write operations in accordance with a second demarcation configuration. In some examples, a second demarcation configuration may be associated with different cell characteristics for a given logic state, such as different distributions of stored charge or other cell property, different demarcation characteristics, or different write operation configuration, among other differences. By overwriting memory cells with a write operation that selectively omits one or more aspects of erasing the associated memory cells, a memory system 110, or some component thereof, may operate with reduced degradation, reduced power consumption, or improved array availability, among other benefits.

FIG. 2 illustrates an example of a memory device 200 that supports overwriting at a memory system in accordance with examples as disclosed herein. In some cases, the memory device 200 may be an example of a memory device 130 as described with reference to FIG. 1. FIG. 2 is an illustrative representation of various components and features of the memory device 200. As such, it should be appreciated that the components and features of the memory device 200 are shown to illustrate functional interrelationships, and not necessarily actual physical positions within the memory device 200. Further, although some elements included in FIG. 2 are labeled with a numeric indicator, some other corresponding elements are not labeled, even though they are the same or would be understood to be similar, in an effort to increase visibility and clarity of the depicted features.

The memory device 200 may include one or more memory cells, such as memory cell 205-a and memory cell 205-b. A memory cell 205 may be, for example, a flash or other type of NAND memory cell, such as in the blow-up diagram of memory cell 205-a.

Each memory cell 205 may be programmed to store a logic value representing one or more bits of information. In some cases, a single memory cell 205—such as an SLC memory cell 205—may be programmed to one of two supported states and thus may store one bit of information at a time (e.g., a logic 0 or a logic 1). In other cases, a single memory cell 205—such as an MLC, TLC, QLC, or other type of multiple-level memory cell 205—may be programmed to one of more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 205 may be programmed to one of sixteen supported states and thus may store four bits of information at a time corresponding to one of sixteen logic values (e.g., 0000, 0001, . . . 1111).

In some cases, a multiple-level memory cell 205 (e.g., an MLC memory cell, a TLC memory cell, a QLC memory cell) may be physically different than an SLC cell. For example, a multiple-level memory cell 205 may use a different cell geometry or may be fabricated using different materials. In some cases, a multiple-level memory cell 205 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

Different types of memory cells 205 may store information in different ways. In a DRAM memory array, for example, each memory cell 205 may include a capacitor that includes a dielectric material (e.g., an insulator) to store a charge representative of a programmable state and thus the stored information. In an FeRAM memory array, as another example, each memory cell 205 may include a capacitor that includes a ferroelectric material to store a charge or a polarization representative of a programmable state and thus the stored information.

In some NAND memory arrays (e.g., flash arrays), each memory cell 205 may include a transistor that has a charge trapping structure (e.g., a floating gate, a replacement gate, or a dielectric material) for storing an amount of charge representative of the logic value. For example, the blow-up in FIG. 2 illustrates a NAND memory cell 205-a that includes a transistor 210 (e.g., a metal-oxide-semiconductor (MOS) transistor) that may be used to store a logic value. The transistor 210 has a control gate 215 and may also include a charge trapping structure 220 (e.g., a floating gate or a replacement gate), where the charge trapping structure 220 is sandwiched between two portions of dielectric material 225. Transistor 210 includes a first node 230 (e.g., a source or drain) and a second node 235 (e.g., a drain or source). A logic value may be stored in transistor 210 by placing (e.g., writing, storing) a quantity of electrons (e.g., an amount of charge) on charge trapping structure 220. The amount of charge to be stored on the charge trapping structure 220 may depend on the logic value to be stored. The charge stored on charge trapping structure 220 may affect the threshold voltage of transistor 210, thereby affecting the amount of current that flows through transistor 210 when transistor 210 is activated (e.g., when a voltage is applied to the control gate 215). In some examples, the charge trapping structure 220 may be an example of a floating gate that may be part of a 3D NAND structure. For example, a 3D NAND may have multiple floating gates arranged around a single channel (e.g., horizontal or vertical channel). Other structures may also be used for a 3D NAND, including the use of replacement gate technology in the place of floating gate.

A logic value stored in transistor 210 may be sensed (e.g., as part of a read operation) by applying a voltage to the control gate 215 (e.g., to control node 240, via the word line 265) to activate transistor 210 and measuring (e.g., detecting, sensing) the resulting amount of current that flows through the first node 230 or the second node 235 (e.g., via a digit line 255). For example, a sense component 270 may determine whether an SLC memory cell 205 stores a logic 0 or a logic 1 in a binary manner (e.g., based on a presence or absence of a current through the memory cell 205 when a read voltage is applied to the control gate 215, or based on whether the current is above or below a current demarcation, such as a threshold current). For a multiple-level memory cell 205, a sense component 270 may determine a logic value stored in the memory cell 205 based on various intermediate demarcation levels (e.g., threshold levels of current) when a read voltage is applied to the control gate 215, or based on evaluating a presence or absence of current through the memory cell based on various intermediate demarcation levels (e.g., multiple different values of read or reference voltages applied to the control gate 215, which may be applied sequentially). In one example of a multiple-level architecture, a sense component 270 may determine the logic value of a TLC memory cell 205 based on seven different demarcations or ranges of a cell characteristic (e.g., seven different levels of current, or ranges of current), that separate the eight potential logic values that could be stored by the TLC memory cell 205.

An SLC memory cell 205 may be written by applying one of two voltages (e.g., a voltage above a threshold or demarcation, a voltage below a threshold or demarcation) to memory cell 205 to store, or not store, an electric charge on the charge trapping structure 220 and thereby cause the memory cell 205 store one of two possible logic values. For example, when a first voltage is applied to the control node 240 (e.g., via the word line 265) relative to a bulk node 245 for the transistor 210 (e.g., when the control node 240 is at a higher voltage than the bulk), electrons may tunnel into the charge trapping structure 220. In some cases, the bulk node 245 may alternatively be referred to as a body node. Injection of electrons into the charge trapping structure 220 may be referred to as programing the memory cell 205 and may occur as part of a program operation. A programmed memory cell may, in some cases, be considered as storing a logic 0. When a second voltage is applied to the control node 240 (e.g., via the word line 265) relative to the bulk node 245 for the transistor 210 (e.g., when the control node 240 is at a lower voltage than the bulk node 245), electrons may leave the charge trapping structure 220. Removal of electrons from the charge trapping structure 220 may be referred to as erasing the memory cell 205 and may occur as part of an erase operation. An erased memory cell may, in some cases, be considered as storing a logic 1. In some cases, memory cells 205 may be programmed at a page 175 level of granularity due to memory cells 205 of a page 175 sharing a common word line 265, and memory cells 205 may be erased at a block 170 level of granularity due to memory cells 205 of a block sharing commonly biased bulk nodes 245.

In contrast to writing an SLC memory cell 205, writing a multiple-level (e.g., MLC, TLC, or QLC) memory cell 205 may involve applying different voltages to the memory cell 205 (e.g., to the control node 240 or bulk node 245 thereof) at a finer level of granularity to more finely control the amount of charge stored on the charge trapping structure 220, thereby enabling a larger set of logic values to be represented. Thus, multiple-level memory cells 205 may provide greater density of storage relative to SLC memory cells 205 but may, in some cases, involve narrower read or write margins or greater complexities for supporting circuitry.

A charge-trapping NAND memory cell 205 may operate similarly to a floating-gate NAND memory cell 205 but, instead of or in addition to storing a charge on a charge trapping structure 220, a charge-trapping NAND memory cell 205 may store a charge representing a logic state in a dielectric material below the control gate 215. Thus, a charge-trapping NAND memory cell 205 may or may not include a charge trapping structure 220.

In some examples, each row of memory cells 205 may be connected to a corresponding word line 265, and each column of memory cells 205 may be connected to a corresponding digit line 255. Thus, one memory cell 205 may be located at the intersection of a word line 265 and a digit line 255. This intersection may be referred to as an address of a memory cell 205. Digit lines 255 may alternatively be referred to as bit lines. In some cases, word lines 265 and digit lines 255 may be substantially perpendicular to one another and may create an array of memory cells 205. In some cases, word lines 265 and digit lines 255 may be generically referred to as access lines or select lines.

In some cases, memory device 200 may include a three-dimensional (3D) memory array, where multiple two-dimensional (2D) memory arrays may be formed on top of one another. This may increase the quantity of memory cells 205 that may be placed or fabricated on a single die or substrate as compared with 2D arrays, which, in turn, may reduce production costs, or increase the performance of the memory array, or both. In the example of FIG. 2, memory device 200 includes multiple levels (e.g., decks) of memory cell 205. The levels may, in some examples, be separated by an electrically insulating material. Each level may be aligned or positioned so that memory cells 205 may be aligned (e.g., exactly aligned, overlapping, or approximately aligned) with one another across each level, forming a memory cell stack 275. In some cases, a memory cell stack 275 may be referred to as a string of memory cells 205 (e.g., as described with reference to FIG. 3).

Accessing memory cells 205 may be controlled through row decoder 260 and column decoder 250. For example, row decoder 260 may receive a row address from memory controller 285 (e.g., an example of a local controller 135) and activate an appropriate word line 265 based on the received row address. Similarly, column decoder 250 may receive a column address from memory controller 285 and activate an appropriate digit line 255. Thus, by activating one word line 265 and one digit line 255, one memory cell 205 may be accessed.

Upon accessing, a memory cell 205 may be read, or sensed, by sense component 270. For example, sense component 270 may be configured to determine the stored logic value of memory cell 205 based on a signal generated by accessing memory cell 205. The signal may include a current, a voltage, or both a current and a voltage on the digit line 255 for the memory cell 205 and may depend on the logic value stored by the memory cell 205. The sense component 270 may include various transistors or amplifiers configured to detect and amplify a signal (e.g., a current or voltage) on a digit line 255. The logic value of memory cell 205 as detected by the sense component 270 may be output via input/output component 280. In some cases, sense component 270 may be a part of column decoder 250 or row decoder 260, or sense component 270 may otherwise be connected to or in electronic communication with column decoder 250 or row decoder 260.

A memory cell 205 may be programmed or written by activating the relevant word line 265 and digit line 255 to enable a logic value (e.g., representing one or more bits of information) to be stored in the memory cell 205. A column decoder 250 or a row decoder 260 may accept data, for example from input/output component 280, to be written to the memory cells 205. As previously discussed, in the case of NAND memory, such as flash memory used in some NAND and 3D NAND memory devices, a memory cell 205 may be written by storing electrons in a charge trapping structure or an insulating layer.

A memory controller 285 may control the operation (e.g., read, write, re-write, refresh) of memory cells 205 through the various components, for example, row decoder 260, column decoder 250, and sense component 270. In some cases, one or more of row decoder 260, column decoder 250, and sense component 270 may be co-located with memory controller 285. A memory controller 285 may generate row and column address signals in order to activate the desired word line 265 and digit line 255. In some examples, a memory controller 285 may generate and control various voltages or currents used during the operation of memory device 200.

In accordance with examples as disclosed herein, one or more components of a memory device 200 may be configured to support overwriting a memory cell 205 with new data, which may be performed without performing an erase operation on the memory cell 205. For example, a memory cell 205 may be programmed and read in accordance with a first demarcation configuration, which may be associated with a first set of write voltages associated with respective logic states, or a first set of one or more reference voltages for distinguishing between the respective logic states, among other cell operating characteristics associated with the first demarcation configuration. Following such operations, the memory cell 205 may be overwritten in accordance with a second demarcation configuration, which may be associated with a second set of write voltages associated with the respective logic states, or a second set of one or more reference voltages for distinguishing between the respective logic states, among other cell operating characteristics associated with the second demarcation configuration. In some examples, the second demarcation configuration may be associated with different cell characteristics for a given logic state, such as different distributions of stored charge or other cell property, different demarcation characteristics (e.g., different reference voltages), different write operations (e.g., different write voltages, different write currents), among other differences relative to the first demarcation configuration. By overwriting memory cells 205 with a write operation that selectively omits one or more aspects of erasing the associated memory cells 205, a memory device 200 may operate with reduced degradation, reduced power consumption, or improved array availability, among other benefits.

FIG. 3 illustrates an example of a memory circuit 300 that supports overwriting at a memory system in accordance with examples as disclosed herein. The memory circuit 300 may be an example of a portion of a memory device, such as a memory device 130 or a memory device 200. Although some elements included in FIG. 3 are labeled with reference numbers, some other corresponding elements are not labeled, though they are the same or would be understood to be similar, in an effort to increase visibility and clarity of the depicted features.

The memory circuit 300 includes multiple memory cells 305 (e.g., flash memory cells 205 as described with reference to FIG. 2) connected in a NAND configuration. In a NAND memory configuration, multiple flash memory cells 305 may connected in series to form strings 310 of memory cells 305, in which a drain of each flash memory cell 305 in the string 310 may be coupled with a source of another flash memory cell 305 in the string.

A string 310 may be a set of memory cells 305 that are each associated with (e.g., coupled with) a corresponding digit line 315. Each memory cell 305 in a string 310 may be associated with a separate word line 330 (e.g., one of word lines 330-a, 330-i, 330-n), such that the quantity of word lines 330 may be equal to the quantity of memory cells 305 in a string 310. A string 310 as shown in FIG. 3 may be an example of aspects of a memory cell stack 275 as described with reference to FIG. 2, for example.

A page 355 may be a set of memory cells 305 that are each associated with (e.g., coupled with) a corresponding word line 330. Thus a string 310 may include memory cells 305 from multiple different pages 355, and a page 355 may include memory cells 305 from multiple different strings 310. A page 355 as shown in FIG. 3 may be an example of aspects of a page 175 as described with reference to FIG. 1, for example.

A block 360 may be a set of multiple pages 355 and thus may also include multiple strings 310. A block 360 as shown in FIG. 3 may be an example of aspects of a block 170 as described with reference to FIG. 1, for example.

In some cases, NAND memory cells 305 may be programmed (e.g., set to a logic 0 value) and read from at the page 355 level of granularity, but may not be erasable (e.g., reset to a logic 1 value) at the page level of granularity. For example, NAND memory may instead be erasable at a higher level of granularity, such as at the block 360 level of granularity. In some cases, a NAND memory cell 305 may be erased before it may be re-programmed. Different memory devices may have different read, write, or erase characteristics.

In some cases, each string 310 of memory cells 305 in the memory circuit 300 may be coupled with a respective string select transistor (SST) 320 at one end of the string 310 and a respective ground select transistor (GST) 325 at the other end of the string 310. The gate of each SST 320 may be coupled with a string select line 345, which may be common to all SST 320 for the block 360. The gate of each GST 325 may be coupled with a ground select line 340, which may be common to all GSTs 325 for the block 360. The source of each GST 325 for the block 360 may be coupled with a common source line 350. And the drain of each SST 320 may be coupled with a respective digit line 315, the respective digit line 315 specific to an individual string 310.

An SST 320 may be used to selectively couple a corresponding string 310 of memory cells 305 to a digit line 315, based on applying a voltage to the string select line 345, and thus to the gate of SST 320. Similarly, a GST 325 may be used to selectively couple the corresponding string 310 of memory cells 305 to the source line 350, based on applying a voltage to ground select line 340, and thus to the gate of GST 325.

To operate the memory circuit 300 (e.g., to perform a program operation, a read operation, or an erase operation on one or more memory cells 305 of the block 360), various voltages may be applied to the string select line 345 (e.g., to the gate of the SSTs 320), to one or more digit lines 315 (e.g., to the drain 335 of one or more SSTs 320), to one or more word lines 330, to the ground select line 340 (e.g., to the gate of the GSTs 325), to the source line 350 (e.g., to the source of the GSTs 325), or to a bulk for the memory cells 305 (not shown) of the block 360. In some cases, each memory cell 305 of a block 360 may have a common bulk, the voltage of which may be controlled independently of bulks for other blocks 360.

In some cases, as part of a read operation for a memory cell 305, a positive voltage may be applied to the corresponding digit line 315 while source line 350 may be grounded or otherwise biased at a voltage lower than the voltage applied to the digit line 315. Concurrently, voltages may be applied to the string select line 345 and the ground select line 340 that are above the threshold voltages of the SST 320 and the GST 325 for the memory cell 305 respectively, thereby turning the SST 320 and GST 325 "ON" such that a channel associated with the string 310 that includes the memory cell 305 may be electrically connected to the corresponding digit line 315 and the source line 350. A channel may be an electrical path through the memory cells 305 in the string 310 (e.g., through the sources and drains of the transistors in the memory cells 305 of the string 310) that may conduct current under some operating conditions.

Concurrently, multiple word lines 330 (e.g., in some cases all word lines 330) of the block 360—except a selected word line 330 coupled with the memory cell 305 to be read)—may be set to a voltage (e.g., VREAD) that is higher than the threshold voltage (VT) of the memory cells 305. VREAD may cause all memory cells 305 in the unselected pages 355 (e.g., rows) to turn "ON" so that each unselected memory cell 305 in the string 310 may maintain high conductivity within the channel. In some examples, the word line 330 associated with the memory cell 305 to be read may be set to a demarcation voltage, VTarget. Where the memory cells 305 are operated as SLC memory cells, VTarget may be a voltage that is between (i) VT of a memory cell 305 in an erased state and (ii) VT of a memory cell 305 in a programmed state.

When the memory cell 305 to be read exhibits an erased VT (e.g., VTarget>VT of the memory cell 305), the memory cell 305 may turn "ON" in response to the application of VTarget to the selected word line 330, which may allow a current to flow in the channel of the string 310, and thus from the digit line 315 to the source line 350. When the memory cell 305 to be read exhibits a programmed VT (e.g., VTarget<VT of the selected memory cell), the memory cell 305 may remain "OFF" despite the application of VTarget to the selected word line 330, and thus may prevent a current from flowing in the channel of the string 310, and thus from the digit line 315 to the source line 350.

A signal on the digit line 315 for the memory cell 305 (e.g., an amount of current below or above a threshold or other demarcation) may be sensed (e.g., by a sense component 270 as described with reference to FIG. 2), and may indicate whether the memory cell 305 became conductive or remained non-conductive in response to the application of VTarget to the selected word line 330. The sensed signal thus may be indicative of whether the memory cell 305 was in an erased state (e.g., storing a logic 1) or a programmed state (e.g., storing a logic 0). In some cases, a single read operation may read one page 355 of memory cells 305, as the memory cells 305 of the page 355 may all share a common word line 330, based on respective signals associated with the respective digit lines 315 for the memory cells 305 of the selected page 355.

Though aspects of the example read operation above have been explained in the context of an SLC memory cell 305 for clarity, one of ordinary skill in the art will appreciate how techniques may be extended or altered and applied to the context of a multiple-level memory cell 305 (e.g., through the use of multiple demarcations, such as multiple values of VTarget, corresponding to the different amounts of charge that may be stored in one multiple-level memory cell 305).

In some cases, as part of a program operation for a memory cell 305, charge may be added to a portion of the memory cell 305 such that current flow through the memory cell 305, and thus the corresponding string 310, may be inhibited when the memory cell 305 is later read. For example, charge may be injected into a charge trapping structure 220 as shown in memory cell 205-a of FIG. 2. In some cases, respective voltages may be applied to the word line 330 and the bulk of the memory cell 305 to be programmed such that the control gate 215 of the memory cell 305 is at a higher voltage than the bulk of the memory cell 305 (e.g., a positive voltage may be applied to the word line 330). Concurrently, voltages may be applied to the string select line 345 and the ground select line 340 that are above the threshold voltages of the SST 320 and the GST 325 for the memory cell 305 respectively, thereby turning the SST 320 and GST 325 "ON," and the digit line 315 for the memory cell 305 to be programmed may be set to a relatively high voltage. This may cause an electric field such that electrons are pulled from the source of the memory cell 305 towards the drain. The electric field may also cause some of these electrons to be pulled through the dielectric material 225 and thereby injected into the charge trapping structure 220 of the memory cell 205, through a process which may in some cases be referred to as tunnel injection. In some cases, programming the memory cell 305 may correspond to writing a logic 0 to the memory cell 305.

In some cases, a single program operation may program some or all memory cells 305 in a page 355, as the memory cells 305 of the page 355 may all share a common word line 330 and a common bulk. For a memory cell 305 of the page 355 for which it is not desired to write a logic 0 (e.g., not desired to program the memory cell 305), the corresponding digit line 315 may be set to a relatively low voltage (e.g., ground), which may inhibit the injection of electrons into the charge trapping structure 220.

Though aspects of the example program operation above have been explained in the context of an SLC memory cell 305 for clarity, one of ordinary skill in the art will appreciate how techniques may be extended and applied to the context of a multiple-level memory cell 305 (e.g., through the use of multiple programing voltages applied to the word line 330, or multiple passes or pulses of a programing voltage applied to the word line 330, corresponding to the different amounts of charge that may be stored in one multiple-level memory cell 305).

In some cases, as part of an erase operation for a memory cell 305, charge may be removed from a portion of the memory cell 305 such that current flow through the memory cell 305, and thus the corresponding string 310, may be uninhibited (e.g., allowed, at least to a greater extent) when the memory cell 305 is later read. For example, charge may be removed from a charge trapping structure 220 as shown in memory cell 205-a of FIG. 2. In some cases, respective voltages may be applied to the word line 330 and the bulk of the memory cell 305 to be erased such that the control gate 215 of the memory cell 305 is at a lower voltage than the bulk of the memory cell 305 (e.g., a positive voltage may be applied to the bulk), which may cause an electric field that pulls electrons out of the charge trapping structure 220 and into the bulk of the memory cell 305. In some cases, a single program operation may erase all memory cells 305 in a block 360, as the memory cells 305 of the block 360 may all share a common bulk.

In some cases, electron injection and removal processes associated with program and erase operations may cause stress on a memory cell 305 (e.g., on the dielectric material 225). Over time, such stress may in some cases cause one or more aspects of the memory cell 305 (e.g., the dielectric material 225) to deteriorate. For example, charge trapping structure 220 may become unable to maintain a stored charge. Such deterioration may be an example of a wearout mechanism for a memory cell 305, and for this or other reasons, some memory cells 305 may support a finite quantity of program and erase cycles. In some examples, a memory device 130 may include an over-provisioning or memory cells (e.g., a quantity of memory cells beyond a stated capacity of the memory device), which may support retirement of memory cells 305 that have experienced a wearout condition, or are otherwise performing insufficiently or unreliably, thereby extending an operable life of the memory device 130 by avoiding operation of retired memory cells 305.

In accordance with examples as disclosed herein, one or more components of a memory circuit 300 may be configured to support overwriting a memory cell 305 with new data, which may be performed without performing an erase operation on the memory cell 205. For example, a memory cell 305 may be programmed and read in accordance with a first demarcation configuration, which may be associated with a first set of cell characteristics associated with respective logic states, or a first set of one or more demarcations for distinguishing between the respective logic states, among aspects of a demarcation configuration. Following such operations, the memory cell 305 may be overwritten in accordance with a second demarcation configuration, which may be associated with a second set of cell characteristics associated with respective logic states, or a second set of one or more demarcations for distinguishing between the respective logic states, among aspects of a demarcation configuration that are different than the first demarcation configuration.

By overwriting memory cells 205 with a write operation that selectively omits one or more aspects of erasing the associated memory cells 205, a memory device 200 may operate with reduced degradation, reduced power consumption, or improved array availability, among other benefits. For example, a given memory cell 205 may support being programmed multiple times before performing an erase operation on the memory cell 205, which may reduce a quantity of a erase operations performed for a total quantity of information written over the life of the memory cell 205. Moreover, in some examples, each successive overwrite configuration may be associated with progressively higher write signaling (e.g., progressively higher write voltages, progressively higher write currents), such that some write operations in an overwrite configuration may store information using write signaling that imposes less programming stress on the memory cell 205 than an initial write configuration that is associated with a highest configured write signaling (e.g., a write configuration that does not support an overwrite configuration. Accordingly, by accumulating less stress from programming and erase operations, the memory cell 205 may support a greater quantity of information written, or an otherwise longer operable life, by reducing an amount of degradation or fatigue of the memory cell.

Figure 4:
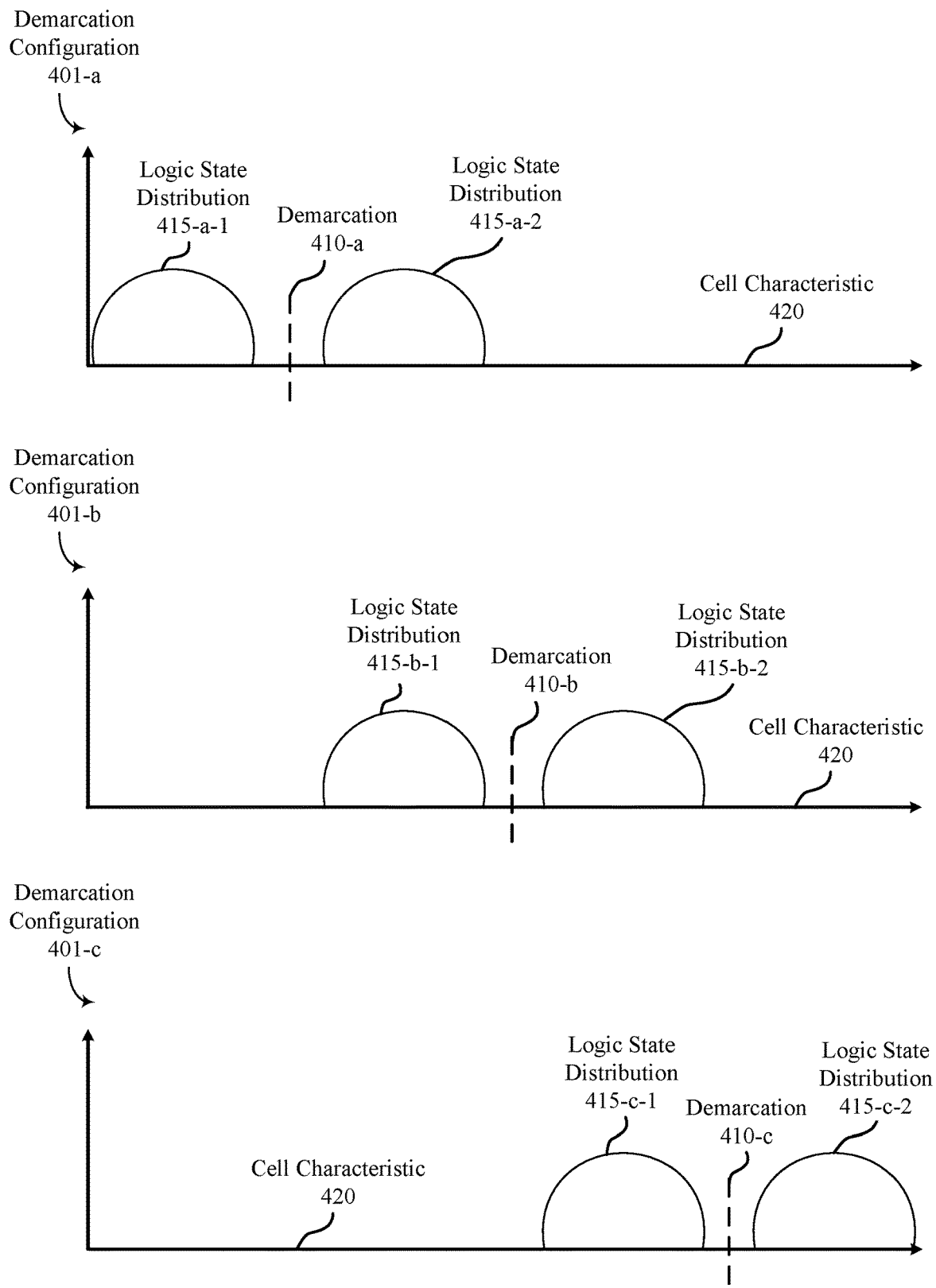
FIGS. 4 and 5 illustrate examples of overwrite schemes that support overwriting at a memory system in accordance with examples as disclosed herein.

FIG. 4 illustrates an example of an overwrite scheme 400 that supports overwriting at a memory system in accordance with examples as disclosed herein. The overwrite scheme 400 may include a demarcation configuration 401-a (e.g., an initial write configuration), a demarcation configuration 401-b (e.g., a first overwrite configuration), and a demarcation configuration 401-c (e.g., a second overwrite configuration), each of which may include a set of logic state distributions 415 and a demarcation 410 relative to a cell characteristic 420. The overwrite scheme 400 may be implemented by one or more components of a memory system 110 as described with reference to FIGS. 1, 2, and 3. For example, one or more components of a memory system 110 may operate at least a portion of a memory die 160 (e.g., one or more memory cells 205 or 305) in accordance with the demarcation configuration 401-a for initial programming and read operations, determine to overwrite the portion of the memory die 160 (e.g., without performing erase operations), and subsequently operate the portion of the memory die 160 in accordance with the demarcation configuration 401-b or the demarcation configuration 401-c.

Each of the demarcation configurations 401 may be described relative to a cell characteristic 420, which may be associated with a physical characteristic of a memory cell itself, or a physical characteristic associated with operating (e.g., reading, writing) a memory cell. In some examples, the cell characteristic 420 may be representative of a voltage or charge, such as a voltage or charge written to or stored by a memory cell, an activation threshold voltage (e.g., VT) of a memory cell, or a voltage or charge resulting from reading a memory cell. In some examples, the cell characteristic 420 may be representative of a resistance or current, such as a detected resistance or current associated with reading a memory cell.

Each of the demarcation configurations 401 may be associated with a set of logic state distributions 415, each of which may correspond to a distribution of values of the cell characteristic 420 that are associated with a respective logic state. For example, in the demarcation configuration 401-a, the logic state distribution 415-a-1 may correspond to a range of values of the cell characteristic 420 that are associated with a logic 1, and the logic state distribution 415-a-2 may correspond to a range of values of the cell characteristic 420 that are associated with a logic 0 (or vice versa). In some examples, the logic state distributions 415 may be representative of different logic states associated with a population of memory cells of a memory die 160. For example, a given logic state distribution 415 may illustrate a distribution of voltages or currents associated with the population of memory cells when programmed with the logic state corresponding to the given logic state distribution. In the example of overwrite scheme 400, each of the demarcation configurations 401 includes two logic state distributions 415, which may correspond to operation in accordance with two logic states. However, other examples of demarcation configurations 401 may be associated with a different quantity of logic state distributions 415 (e.g., to support overwrite implementations with more than two logic states, such as in a multiple-level cell overwrite configuration).

Each of the logic state distributions 415 may be associated with a respective write operation configuration, such as a respective write voltage or write current, for programming a memory cell with the corresponding logic state. For example, in the demarcation configuration 401-a, memory cells may be programmed in accordance with the logic state distribution 415-a-1 (e.g., to write a logic 1) by applying a first write voltage or write current, and memory cells may be programmed in accordance with the logic state distribution 415-a-1 (e.g., to write a logic 0) by applying a second write voltage or write current having a different value (e.g., a higher value, a lower value) than the first write voltage or write current. In various examples, such techniques may be supported by a single respective write signal associated with each of the logic state distributions 415, or multiple respective write signals (e.g., having different configurations, such as different magnitudes or timings).

Each of the demarcation configurations 401 may also be associated with a demarcation 410, which may illustrate a value of the cell characteristic 420 that supports distinguishing between logic state distributions 415 (e.g., a demarcation between logic states, supporting an evaluation or distinction between one logic state and another logic state). For example, a demarcation 410 may be illustrative of a read demarcation, such as a reference voltage (e.g., a reference voltage such as VTarget applied to a control gate 215 to evaluate a presence or absence of current through a memory cell, a reference voltage compared to a sensed voltage when reading a memory cell), a reference current, or a reference resistance used to evaluate whether a memory cell was programmed with or is otherwise storing a cell characteristic 420 associated with a logic 1 or a logic 0. In the example of overwrite scheme 400, each of the demarcation configurations 401 includes a single demarcation 410 for distinguishing between two respective logic state distributions 415 associated with two logic states. However, other examples of demarcation configurations 401 may be associated with a different quantity of demarcations 410 to support other evaluations between two or more logic states, or evaluations between two or more logic state distributions 415.

The example of overwrite scheme 400 illustrates a progression of demarcation configurations 401 that may be implemented by a memory system 110 that supports overwrite techniques in accordance with examples as disclosed herein. For example, the demarcation configuration 401-a may illustrate an initial demarcation configuration associated with an initial programming of memory cells that have been erased, or that have not been previously programmed. In accordance with the demarcation configuration 401-a, memory cells of at least a portion of a memory array may be programmed by applying a first write signal (e.g., a write voltage, a write current) associated with a first logic state (e.g., a logic 1) for memory cells included in the logic state distribution 415-a-1, or by applying a second write signal associated with a second logic state (e.g., a logic 0) for memory cells included in the logic state distribution 415-a-2. After such programming, to evaluate whether a given memory cell has been programmed with the first logic state or the second logic state, the memory system 110 may support performing a read operation in accordance with the demarcation 410-a (e.g., evaluating whether a value of the cell characteristic 420 associated with a memory cell being read is below the demarcation 410-a, which may indicate a logic 1, or is above the demarcation 410-a, which may indicate a logic 0).

In various implementations, a portion of (e.g., a controller of) a memory system 110 may determine to overwrite memory cells that are being or have been operated in accordance with the demarcation configuration 401-a, which may include a transition to operating such memory cells in accordance with the demarcation configuration 401-b (e.g., a first overwrite demarcation configuration). In accordance with the demarcation configuration 401-b, memory cells may be programmed by applying a first write signal (e.g., a write voltage, a write current) associated with a first logic state (e.g., a logic 1) for memory cells included in the logic state distribution 415-b-1, or by applying a second write signal associated with a second logic state (e.g., a logic 0) for memory cells included in the logic state distribution 415-b-2. After such programming, to evaluate whether a given memory cell has been programmed with the first logic state or the second logic state, the memory system 110 may support performing a read operation in accordance with the demarcation 410-b (e.g., evaluating whether a value of the cell characteristic 420 associated with a memory cell being read is below the demarcation 410-b, which may indicate a logic 1, or is above the demarcation 410-b, which may indicate a logic 0). Thus, memory cells that are being operated in accordance with the demarcation configuration 401-b may be configured as SLC memory cells (e.g., programmed or configured in accordance with a single demarcation 410, programmed in accordance with one of two possible logic states), and the logic states may be read via a single level read operation (e.g., a read operation associated with a single reference voltage or single reference current). However, in the example of demarcation configuration 401-b, the ranges of values of the cell characteristic 420 associated with the respective logic state distributions 415-b, and the value of the cell characteristic 420 of the demarcation 410-b, may be shifted along the axis of the cell characteristic 420 (e.g., to a higher magnitude).

In some implementations, the overwriting of memory cells in accordance with the demarcation configuration 401-b may support writing (e.g., overwriting) information to a portion of a memory array that was previously written to, but without an intervening erase operation. For example, because the logic state distribution 415-b-2 is associated with a range of values of the cell characteristic that are non-overlapping with either the logic state distribution 415-a-1 or the logic state distribution 415-a-2, the logic state distribution 415-b-2 may be distinguishable (e.g., in accordance with the demarcation 410-b) from those values of the cell characteristic 420 associated with the logic state distributions 415-a-1 and 415-a-2. In a NAND memory architecture, for example, such techniques may be supported when each of two or more logic state distributions 415 of an overwrite demarcation configuration 401 (e.g., demarcation configurations 401-b and 401-c) have respective ranges of the cell characteristic 420 that are greater than or equal to the logic state distributions 415 or a prior demarcation configuration (e.g., no less than those of a preceding demarcation configuration 401, such as demarcation configuration 401-a).

In some implementations, such a transition may be supported by a write signal associated with the logic state distribution 415-b-2 having a magnitude that is greater than a write signal associated with the logic state distribution 415-a-2 (e.g., a higher voltage, a higher current). In various examples, the logic state distribution 415-b-1 may have a range of values of the cell characteristic 420 that are the same as, partially overlapping, or at least in part greater than or equal to (e.g., no less than) the range of values of the logic state distribution 415-a-2. For example, a write signal associated with the logic state distribution 415-b-1 may have a magnitude that is equal to or greater than a write signal associated with the logic state distribution 415-a-2. Thus, in some examples, the demarcation configuration 401-b may be associated with no memory cells being written in accordance with a range of values of the cell characteristic 420 that were previously associated with the logic state distribution 415-a-1 of the demarcation configuration 401-a.

In some examples, operation in accordance with some demarcation configurations 401 (e.g., the demarcation configuration 401-a) may involve relatively lower programming stress than other demarcation configurations (e.g., the demarcation configurations 401-b or 401-c), which may be related to the relatively lower magnitude of write signaling associated with such demarcation configurations 401. Thus, the example of overwrite scheme 400 may illustrate an example of operating a portion of a memory array in an SLC overwrite mode with a reduced margin (e.g., compared a margin associated with the logic state distribution 415-*a*-1 corresponding to one logic state and the logic state distribution 415-*b*-2 corresponding to another logic state), which may reduce memory cell fatigue. By supporting data being written with lower programming stress in some demarcation configurations before reaching a highest configured level of programming stress (e.g., associated with the demarcation configuration 401-*c*), a memory cell may support a relatively higher quantity of new information being written (e.g., in accordance with a sequence of the demarcation configurations 401-*a*, 401-*b*, and 401-*c*) before reaching a highest configured programming stress and a subsequent erase operation, which may support a higher rating for TBW for the associated memory device.

An assignment of logic states to logic state distributions 415-*b*-1 and 415-*b*-2 may be configured in accordance with various techniques, including such assignments that may be relative to the assignment of logic states in the demarcation configuration 401-*a*. For example, in a configuration that maintains positioning relative to a demarcation 410, logic state distributions 415 that are less than a demarcation 410 may be associated with one logic state (e.g., where logic state distributions 415-*a*-1 and 415-*b*-1 are each associated with a logic 1), and logic state distributions 415 that are greater than a demarcation 410 may be associated with another logic state (e.g., where logic state distributions 415-*a*-2 and 415-*b*-2 are associated with a logic 0). In another example, in a configuration that maintains a logic state for a range of values of the cell characteristic 420 (e.g., where logic state distributions 415-*a*-2 and 415-*b*-1 are substantially coextensive, or coextensive within a threshold), logic state distributions 415-*a*-2 and 415-*b*-1 may each be associated with a logic 0, and logic state distributions 415-*a*-1 and 415-*b*-1 may each be associated with a logic 1. In some examples, a memory system may support a dynamic selection of such an assignment, such as an selection that, from one demarcation configuration 401 to another, minimizes a quantity of memory cells being written with relatively higher write signaling, or minimizes a quantity of memory cells being written in general, among other criteria, which may be evaluated on a page level, a block level, or a plane level, among other granularities.

In some examples, by maintaining a single demarcation 410 for each demarcation configuration 401, the overwrite scheme 400 may support overwriting with relatively faster or lower-complexity sensing schemes or circuitry. For example, the overwrite scheme 400 may support a same or similar read bandwidth as other SLC configurations, including SLC configurations or other techniques for single-level read operations that may not be configured to support overwrite techniques.

A memory system 110 may support any quantity of one or more overwrite demarcation configurations 401 in accordance with the example of overwrite scheme 400. For example, in a configuration that supports a second overwrite demarcation configuration, a portion of memory system 110 may determine to overwrite memory cells that are being or have been operated in accordance with the demarcation configuration 401-*b*, which may include operating such memory cells in accordance with the demarcation configuration 401-*c*. In accordance with the demarcation configuration 401-*c*, memory cells may be programmed by applying a first write signal associated with a first logic state (e.g., a logic 1) for memory cells included in the logic state distribution 415-*c*-1, or by applying a second write signal associated with a second logic state (e.g., a logic 0) for memory cells included in the logic state distribution 415-*c*-2. After such programming, to evaluate whether a given memory cell has been programmed with the first logic state or the second logic state, the memory system 110 may support performing a read operation in accordance with the demarcation 410-*c* (e.g., evaluating whether a value of the cell characteristic 420 of a memory cell being read is below the demarcation 410-*c*, which may indicate a logic 1, or is above the demarcation 410-*c*, which may indicate a logic 0). In some cases, a memory system 110 may utilize check failure byte tracking for each successive write (e.g., to ensure accuracy of access operations after successive overwrites).

In some examples, a duration for writing memory cells in accordance with successive overwrites (e.g., programming operations in accordance with the demarcation configurations 401-*b* and 401-*c*) may increase. For example, increased write signal magnitudes may involve a longer duration to reach a higher voltage, or a higher stored charge, or a longer time to invoke a physical change of a memory cell, among other phenomena. Accordingly, a configured duration for performing programming operations may be increased, or otherwise changed, from one demarcation configuration 401 to another.

In some examples, a difference in the cell characteristic 420 between demarcations 410 from one demarcation configuration 401 to another, or a difference between highest logic state distributions 415 from one demarcation configuration 401 to another, may be considered a step (e.g., a voltage step). In some cases, such a step may be configured to be relatively small, which may be associated with avoiding an overshooting of a threshold (e.g., a voltage threshold) associated with writing data to the memory cell. Moreover, by implementing a small step between successive demarcation configurations 401, a memory system 110 may support a greater quantity of demarcation configurations 401 (e.g., a greater quantity of overwrites) without exceeding such a threshold.

In some examples, a portion of a memory that supports the overwrite scheme 400, among others, may be operable in accordance with an overwrite scheme and another multiple-level cell configuration. For example, a portion of a memory array may support operation in accordance with four logic state distributions 415, and such logic state distributions 415 may be associated with (e.g., statically, dynamically) operating either in an MLC configuration where each of the four logic state distributions 415 may store one of four logic states (e.g., a logic 00, a logic 01, a logic 10, or a logic 11) at a given time, or in an SLC overwrite configuration where, for each demarcation configuration 401, two logic state distributions 415 may be used to support a logic 0 and a logic 1. For example, in the context of the logic state distributions 415 of the overwrite scheme 400, an MLC configuration may be supported when the logic state distribution 415-*a*-1 corresponds to a logic 00, the logic state distributions 415-*a*-2 and 415-*b*-1 correspond to a logic 01, the logic state distributions 415-*b*-2 and 415-*c*-1 correspond to a logic 10, and the logic state distribution 415-*c*-2 corresponds to a logic 11, among other associations. In some such examples, the demarcations 410-*a*, 410-*b*, and 410-*c* may be associated with multi-level read operations or circuitry to support MLC operation and, in some examples, such operations or circuitry may be operated with reduced power consumption or increased read bandwidth when operating in an overwrite scheme (e.g., an SLC overwrite scheme, related to the use of a single demarcation 410 at a time).

In some examples, such conditions may be considered by a memory system 110 for determining how to configure or operate such a portion of a memory device 130. For example, a memory system 110 may determine to operate in an MLC mode for relatively higher capacity, for information that is less likely to be replaced, for information or operating conditions where read bandwidth is relatively less important, or for conditions where stress associated with programming and erase operations is relatively less important. In some examples, a memory system 110 may determine to operate in an SLC overwrite mode or other overwrite mode for information that is more likely to be replaced (e.g., L2P tables, write booster buffers, parity data), for information or operating conditions where read bandwidth is relatively more important, or for conditions where stress associated with programming and erase operations is relatively more important. In some examples, a memory system 110 may make such determinations dynamically (e.g., based on current operating conditions), or a memory system 110 may configure certain portions of a memory device 130 to operate in an MLC mode and certain other portions of a memory device 130, or another memory device 130, to operate in an overwrite mode. Although described in the context of four logic state distributions 415, and a tradeoff between an MLC mode and SLC demarcation configurations 401, such techniques may be applied to any quantity of logic state distributions 415 and various implementations of multiple-level write configurations (e.g., a TLC write configuration, a QLC write configuration) and overwrite configurations (e.g., SLC overwrite configurations, multiple-level overwrite configurations).

In some cases, access operation signaling (e.g., read operation signaling or write operation signaling, command signaling between a memory system controller 115 and a memory device 130) may indicate a demarcation configuration 401, or a demarcation 410 thereof (e.g., an indication of a reference voltage). For example, command signaling may direct a memory device 130 to write logic states to memory cells in accordance with a particular demarcation configuration 401 or demarcation 410, or to read logic states from memory cells in accordance with a particular demarcation configuration 401 or demarcation 410. In some examples, demarcation configurations 401 may be managed by a memory device 130 (e.g., by a local controller 135), in which case access operation signaling may omit indications of a demarcation. For example, a memory device 130 (e.g., a local controller 135) may determine to overwrite a portion of a memory with new information, which may be associated with a transition from one demarcation configuration 401 to another (e.g., as determined at the memory device).

In some cases, a component of a memory system 110 (e.g., a memory system controller 115, a local controller 135) may track a quantity of overwrites, or a demarcation configuration 401 or demarcation 410 thereof, to determine which demarcation configuration 401 to use in future overwrites. For example, multiple modes for read offsets (e.g., an A/B/C mode) may be stored per portion of a memory array (e.g., per block, per page) in a component of the memory system 110. In some cases, firmware at the memory system 110 may track the read offsets stored in the system. The overwrite scheme 400 may enable the memory device 130 to save some quantity of erase cycles (e.g., the memory device 130 may not erase or perform garbage collection to write new data to the cell), or may reduce a single level cell program-erase cycle requirement, among other benefits.

Figure 5:
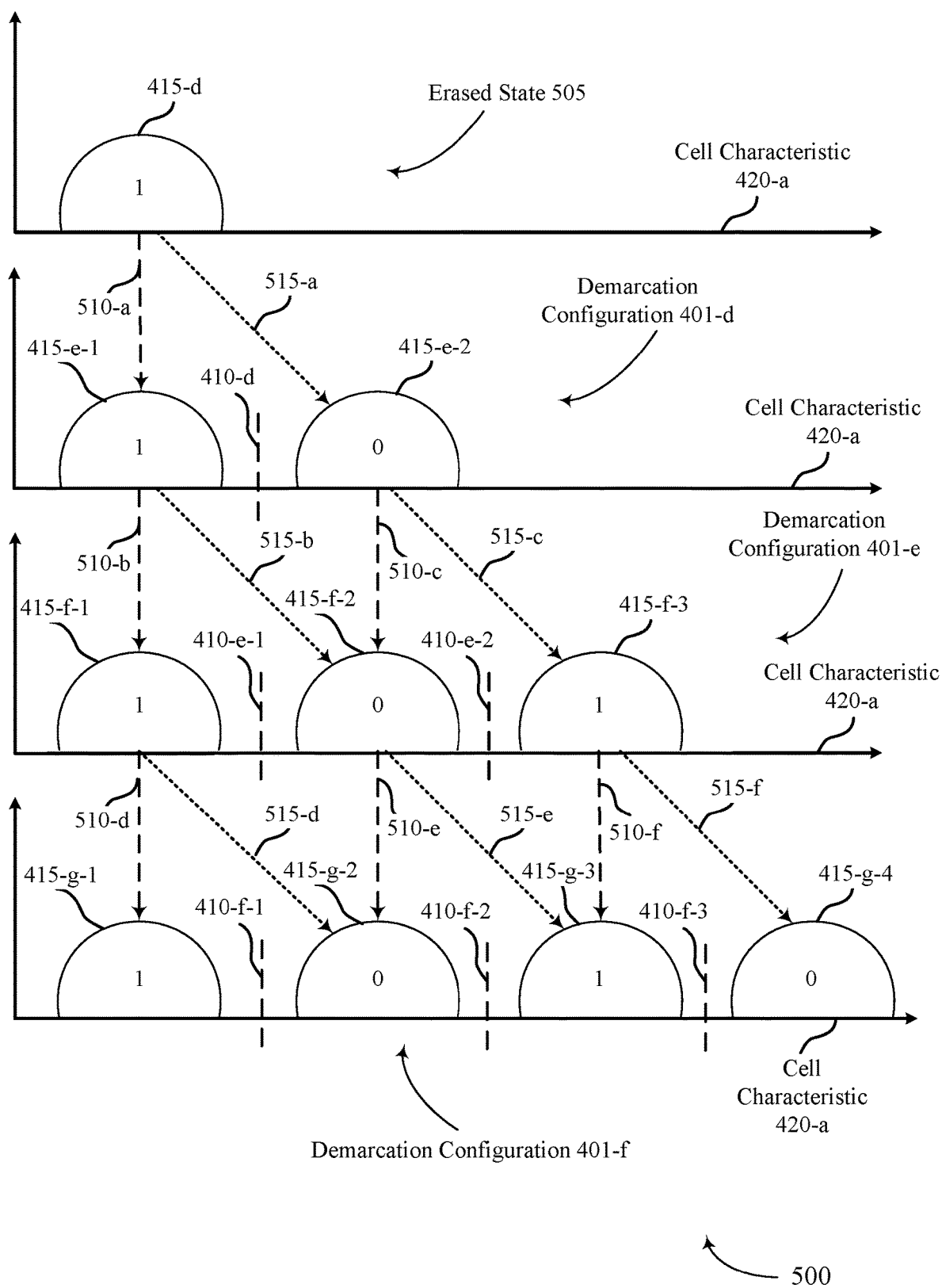

FIG. 5 illustrates an example of an overwrite scheme 500 that supports overwriting at a memory system in accordance with examples as disclosed herein. The overwrite scheme 500 may include an erased state 505, where erased memory cells may, in some cases, be considered as storing a logic 1 (e.g., associated with a cell characteristic 420-a that is within a logic state distribution 415-d). The overwrite scheme 500 may also include demarcation configurations 401-d (e.g., an initial write configuration), 401-e (e.g., a first overwrite configuration), and 401-f (e.g., a second overwrite configuration). The overwrite scheme 500 may be implemented by one or more components of a memory system 110 as described with reference to FIGS. 1, 2, and 3.

In the example of overwrite scheme 500, each of the demarcation configurations 401 may be described relative to a cell characteristic 420-a, which may be an example of a cell characteristic 420 as described with reference to FIG. 4. Each of the demarcation configurations 401 may also be associated with a respective set of logic state distributions 415, each of which may correspond to a distribution of values of the cell characteristic 420-a that are associated with a respective logic state, and each of which may be associated with a respective write operation configuration for programming a memory cell with the corresponding logic state. Each of the demarcation configurations 401 may also be associated with one or more demarcations 410, which may illustrate a value of the cell characteristic 420-a that supports distinguishing between logic state distributions 415.

The example of overwrite scheme 500 illustrates another progression of demarcation configurations 401 that may be implemented by a memory system 110 that supports overwrite techniques in accordance with examples as disclosed herein. For example, when performing an overwrite operation, a transition between one demarcation configuration 401 and another may involve one or more preserve operations 510 on memory cells of a portion of a memory array (e.g., to preserve a value of the cell characteristic 420-a, to preserve a logic state), one or more flip operations 515 on memory cells of the portion of the memory array (e.g., to change a value of the cell characteristic 420-a, to flip a logic state), or various combinations thereof. In some examples, such a transition may involve evaluating a stored state (e.g., a logic state, a value of the cell characteristic 420-a) of a given memory cell to determine whether to perform a preserve operation 510 or a flip operation 515. For example, for each memory cell in a portion of memory that is being overwritten, the memory system 110 (e.g., a memory device 130, a local controller 135) may evaluate whether to preserve a logic state or cell characteristic 420-a stored at the memory cell, or to change a logic state of cell characteristic 420-a stored at the memory cell. In various examples, such operations may be performed on a portion of a memory array that is marked as storing invalid data, and such operations may be followed by marking the portion of the memory array as storing valid data whether or not a write signal was applied.

In some examples, for a portion of a memory array that is associated with the erased state 505, all memory cells may be initially associated with a logic state distribution 415-d, which may be associated with a logic 1 (e.g., a first logic state). To program memory cells in accordance with the demarcation configuration 401-d, a memory device 130 may perform a preserve operation 510-a to establish a memory cell as storing a logic 1 (e.g., the first logic state), or a flip operation 515-a to establish a memory cell as storing a logic 0 (e.g., a second logic state). In some examples, the preserve operation 510-a may be associated with applying a first write signal (e.g., a write voltage or write current associated with the preserve operation 510-a or the logic state distribution 415-e-1, a refresh signal), and the flip operation 515-a may be associated with applying a second write signal (e.g., a write voltage or write current associated with a flip operation 515-*a* or the logic state distribution 415-*e*-2). In some examples, the preserve operation 510-*a* may be associated with applying a null or zero bias to a memory cell, or may be associated with refraining from applying a write signal to the memory cell, thereby maintaining the cell characteristic 420-*a* or the logic state that was already programmed to the memory cell.

In some examples, the transition from the erased state 505 to the demarcation configuration 401-*d* may be performed without evaluating memory cells for a stored logic state or cell characteristic 420-*a* (e.g., prior to performing a preserve operation 510-*a* or a flip operation 515-*a*), such as when an indication that the portion of the memory array has been erased is associated with the memory cells being in a known state. In other words, the determination of whether to perform the preserve operation 510-*a* or the flip operation 515-*a* on a target memory cell may be based on the logic state to be written to the target memory cell, and may be independent of a current state of the target state memory cell. After performing preserve operations 510-*a* or flip operations 515-*a* on respective memory cells of a portion of a memory array, the portion of the memory array may store data in accordance with the demarcation configuration 401-*d*. To evaluate whether a given memory cell has been programmed with a logic 1 or a logic 0, the memory system 110 may support a read operation in accordance with the demarcation 410-*d* (e.g., evaluating whether a value of the cell characteristic 420-*a* is below the demarcation 410-*d*, which may indicate a logic 1, or is above the demarcation 410-*d*, which may indicate a logic 0).

In various implementations, a portion of a memory system 110 may determine to overwrite a portion of a memory array that has been operated in accordance with the demarcation configuration 401-*d*, which may include operating such memory cells in accordance with the demarcation configuration 401-*e* (e.g., a first overwrite demarcation configuration). In some examples, an overwrite transition from the demarcation configuration 401-*d* to the demarcation configuration 401-*e* may be supported by an evaluation of memory cells to determine whether to perform a preserve operation 510 or a flip operation 515.

For example, to establish a memory cell as storing a logic 1, the memory cell may first be evaluated in a read or other sense operation to determine a current logic state or value of the cell characteristic 420-*a* for the memory cell. If the memory cell is associated with a logic state or value of the cell characteristic 420-*a* corresponding to the logic state distribution 415-*e*-1, a preserve operation 510-*b* may be performed such that a value of the cell characteristic 420-*a* associated with the written memory cell is within the logic state distribution 4154-1. The preserve operation 510-*b* may be associated with applying the first write signal, or may be associated with refraining from applying a write signal to the memory cell. If the memory cell is associated with a logic state or value of the cell characteristic 420-*a* corresponding to the logic state distribution 415-*e*-2, a flip operation 515-*c* may be performed such that a value of the cell characteristic 420-*a* associated with the written memory cell is within the logic state distribution 415-*f*-3, which illustrates a second logic state distribution 415 (e.g., multiple logic state distributions 415) corresponding to a logic 1. The flip operation 515-*c* may be associated with applying a third write signal (e.g., a write voltage or write current associated with the flip operation 515-*c* or the logic state distribution 415-*f*-3), which may have a higher magnitude than both the first write signal and the second write signal.

In some examples, to establish a memory cell as storing a logic 0, the memory cell also may be first be evaluated in a read or other sense operation to determine a current logic state or value of a cell characteristic 420-*a* for the memory cell. If the memory cell is associated with a logic state or value of the cell characteristic 420-*a* corresponding to the logic state distribution 415-*e*-1, a flip operation 515-*b* may be performed such that a value of the cell characteristic 420-*a* associated with the written memory cell is within the logic state distribution 415-*f*-2. In some implementations, the flip operation 515-*b* may be associated with applying the second write signal, such as when the logic state distributions 415-*e*-2 and 415-*f*-2 are substantially coextensive, or coextensive within a threshold. If the memory cell is associated with a logic state or value of the cell characteristic 420-*a* corresponding to the logic state distribution 415-*e*-2, a preserve operation 510-*c* may be performed such that a value of the cell characteristic 420-*a* associated with the written memory cell is within the logic state distribution 415-*f*-2. The flip operation 515-*c* may also be associated with applying the second write signal, or may be associated with refraining from applying a write signal to the memory cell. In some examples, since the logic state distribution 415-*f*-2 may be associated with the second write signal irrespective a prior state of the memory cell, programming a logic 0 in an overwrite transition to the demarcation configuration 401-*e* may be performed without an evaluation of the memory cell to be written.

After performing preserve operations 510-*b* or 510-*c*, or flip operations 515-*b* or 515-*c*, the portion of the memory array may store data in accordance with the demarcation configuration 401-*e*. To evaluate whether a given memory cell has been programmed with a logic 1 or a logic 0, the memory system 110 may support read operations in accordance with the demarcations 410-*e*-1 and 410-*e*-2, which illustrates an example of an increased quantity of demarcations 410 (e.g., two demarcations 410) for a given quantity of logic states (e.g., two logic states). In some examples, each demarcation 410-*e* may be associated with a respective read operation (e.g., multiple single-level reads, such as when a demarcation 410-*e* illustrates a reference voltage applied to a control gate 215). If the memory system 110 determines (e.g., in one read evaluation) that a value of the cell characteristic 420-*a* of a memory cell is below the demarcation 410-*e*-1, the memory system 110 may determine that the memory cell is within the logic state distribution 4154-1 (e.g., associated with a logic state 1). If the memory system 110 determines that a value of the cell characteristic 420-*a* of the memory cell is above the demarcation 410-*e*-1, a logic state evaluation may be supported by a read evaluation in accordance with the demarcation 410-*e*-2. If the memory system 110 determines that a value of the cell characteristic 420-*a* of the memory cell is below the demarcation 410-*e*-2, the memory system 110 may determine that the memory cell is within the logic state distribution 415-*f*-2 (e.g., associated with a logic state 0), and if the memory system 110 determines that a value of the cell characteristic 420-*a* of the memory cell is above the demarcation 410-*e*-2, the memory system 110 may determine that the memory cell is within the logic state distribution 415-*f*-3 (e.g., associated with a logic state 1). Although described in the context of different operations, in some examples, the demarcations 410-*e*-1 and 410-*e*-2 may be associated with levels of a multi-level read operation or sensing circuitry.

A memory system 110 may support any quantity of one or more overwrite demarcation configurations 401 in accordance with the example of overwrite scheme 500. For example, in a configuration that supports a second overwrite demarcation configuration, a portion of memory system 110 may determine to overwrite a portion of a memory array that has been operated in accordance with the demarcation configuration 401-e, which may include operating the portion of the memory array in accordance with the demarcation configuration 401-f. A transition from the demarcation configuration 401-e to the demarcation configuration 401-f may be supported by various preserve operations 510 and flip operations 515 as illustrated, which may be supported by evaluations of the memory cells prior to such operations in accordance with examples as disclosed herein. After performing such operations, the portion of the memory array may store data in accordance with the demarcation configuration 401-f. To evaluate whether a given memory cell has been programmed with a logic 1 or a logic 0, the memory system 110 may support read operations in accordance with the demarcations 4104-1, 410-f-2, and 410-f-3, which may be performed by various single-level or multi-level techniques.

The overwriting of memory cells in accordance with the overwrite scheme 500 illustrates another example for writing (e.g., overwriting) information to a portion of a memory that was previously written to, but without an intervening erase operation. For example, to support a transition from one demarcation configuration 401 to another in the overwrite scheme 500, a memory device 130 may determine whether to overwrite a memory cell with a flip operation 515 or to preserve the previously-written state with a preserve operation 510. In some examples, such operations in accordance with the overwrite scheme 500 may reduce a quantity of write signals applied to memory cells, or reduce a magnitude of write signals written to memory cells, which may reduce power consumption or degradation of the memory cells, among other advantages. Although such techniques may be associated with relatively slower read bandwidth than the overwrite scheme (e.g., related to the implementation of multi-level reads in the demarcation configurations 401-e and 401-f), the reduced occurrence and magnitude of write operations may be associated with improvements to cycling fatigue, cell degradation, and overall operating life of the memory device (e.g., greater TBW, higher program/erase endurance).

Although the example of overwrite scheme 500 illustrates a technique where logic states are maintained within respective ranges of the cell characteristic 420-a, in some examples, logic states corresponding to respective ranges of the cell characteristic 420-a may be flipped with successive overwrites. In some examples, such logic state assignments may be determined based on a proportion of cells that may be maintained in a given state, such as a comparison of preserve operations 510 and flip operations 515 that would result in one logic state assignment versus another. Moreover, like the example of overwrite scheme 400, each of the logic state distributions 415 of the overwrite scheme 500 may be associated with or otherwise configurable with another multiple-level cell mode (e.g., an MLC, TLC, or QLC mode), and a memory system 110 or memory device 130 may be configured to determine whether to operate in accordance with one or more aspects of the overwrite scheme 500, or not, depending on various factors or operating conditions.

In some implementations, a memory system 110 may be configured to support aspects of both the overwrite scheme 400 and the overwrite scheme 500, among others, and a memory system 110 may be configured to operate in accordance with one or the other depending on a performance tradeoff for a memory device 130, or a portion thereof (e.g., for one portion of a memory array versus another). In some examples, aspects of the overwrite scheme 400 may be selected for relatively low latency, associated with the single or otherwise consistent quantity of demarcations 410 for each demarcation configuration 401. In some examples, aspects of the overwrite scheme 500 may be selected for relatively low power consumption or relatively low fatigue or degradation, associated with the potential for omitting write operations or for performing relatively lower magnitude write operations, despite the relatively more-complex read operations. In some examples, each portion of a memory array may be configured with an enabling or disabling of overwrite techniques, or configured with a particular overwrite scheme or configuration thereof, which may correspond to a type of implementation of a given memory device 130, or a priority or other characteristic for information stored at the memory device 130, which may be accommodated by various granularities of such configurations. In some examples, such techniques may be determined or configured for particular types of information, or physical allocations associated with particular types of information, such as L2P tables, parity information, or other relatively transient data. In some examples, such techniques may be associated with a garbage collection "in-place," which may avoid an erase operation associated with such garbage collection. In some examples, such determinations may be based on an associated firmware complexity, a relative propensity for read disturbances, an associated ra bit error rate (RBER), a read bandwidth or latency, or a booster buffer availability, among other considerations.

Figure 6A:
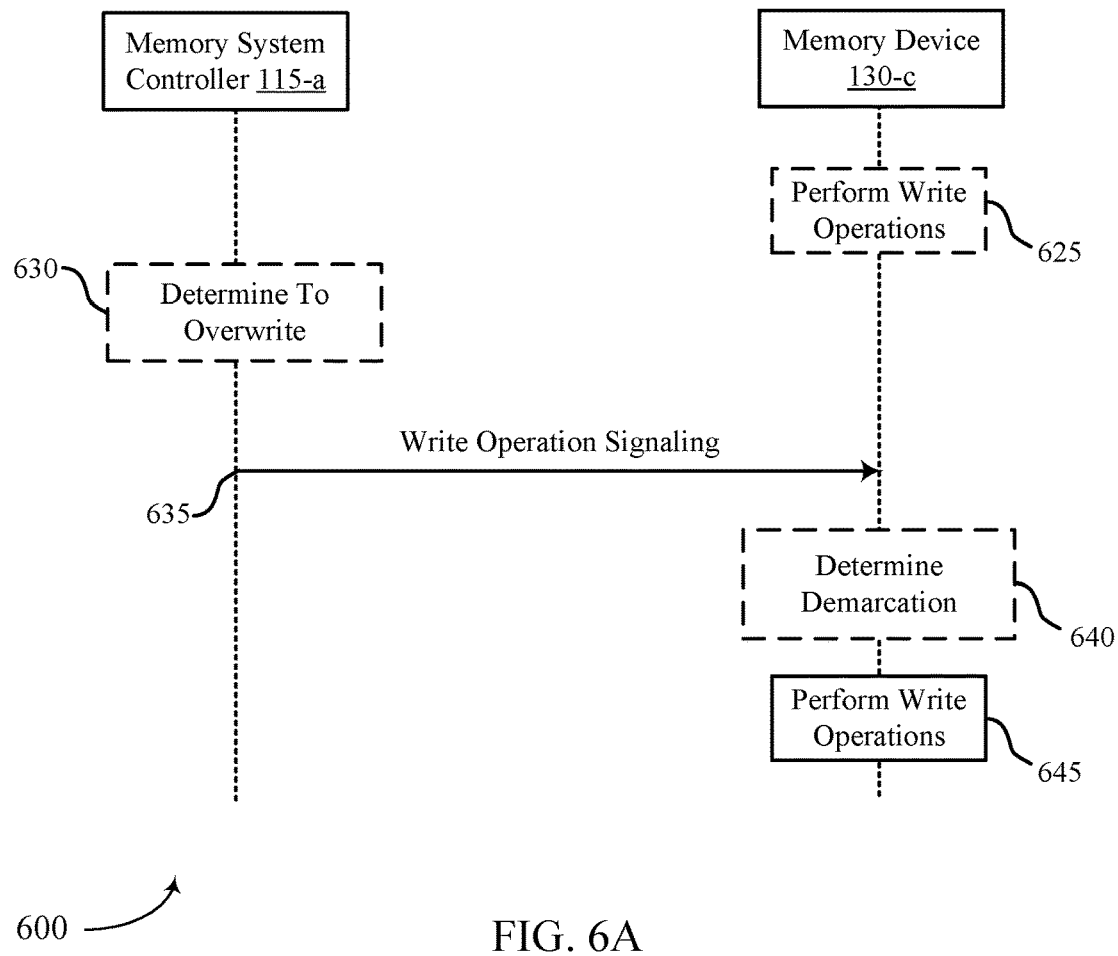
FIGS. 6A and 6B illustrate examples of process flows that support overwriting at a memory system in accordance with examples as disclosed herein.

FIG. 6A illustrates an example of a process flow 600 that supports overwriting at a memory system in accordance with examples as disclosed herein. Process flow 600 may be implemented by one or more components of a memory system 110 as described with reference to FIGS. 1-3. For example, aspects of the process flow 601 may be performed by or between a memory system controller 115-a and a memory device 130-c.

At 625, the memory system (e.g., the memory device 130-c) may perform write operations to store first information at a portion of a memory array (e.g., of the memory device 130-c). The write operations may be performed in accordance with a first demarcation (e.g., a first voltage demarcation, a first demarcation configuration 401). In some examples, the write operations of 625 may be performed in accordance with an initial demarcation configuration 401, or an intermediate overwrite demarcation configuration 401, that may be subsequently overwritten. Writing the first information may be associated with a first set of write signaling or values of a cell characteristic 420 (e.g., voltage, current, resistance) associated with written logic states. The writing at 625 may be associated with a quantity of logic states, such as two logic states in an SLC operating mode and, in some examples, the quantity of logic states may be fewer than a total operable quantity of logic states for the portion of the memory array (e.g., which may be operable in an MLC mode, a TLC mode, or a QLC mode, among others). The write operations of 625 may be responsive to a write command received from a host system 105, or may be associated with memory management operations, such as wear leveling or garbage collection, among other examples. In various examples, performing the write operations of 625 may be associated with the memory system controller 115-a or the memory device 130-c storing an indication of a quantity of overwrites performed at the portion of the memory array, or an indication that the portion of the memory array was written in accordance with a particular demarcation configuration 401 or demarcation 410 thereof. In some examples (e.g., when the write operations of 625 are performed in response to signaling from the memory system controller 115-*a*), the write operations of 625 may be an example of, or at least a portion of, the memory system controller 115-*a* performing write operations in accordance with an overwrite demarcation configuration 401. In some examples, such a write operation may be performed on a portion of a memory allocated with an overwrite scheme (e.g., an overwrite scheme 400 or 500), or the memory system controller 115-*a* or the memory device 130-*c* may determine to perform the write operations at 625 in a manner that would support subsequent overwriting, which may be based on a type of information, or a desired operating or performance condition (e.g., write bandwidth, read bandwidth, degradation configuration), among other considerations.

At 630, in some examples, the memory system (e.g., the memory system controller 115-*a*) may determine to overwrite the portion of the memory array. In some examples, such an overwrite determination may be based on a validity indication associated with the portion of the memory array (e.g., an indication that data stored at the portion of the memory array is invalid or no longer needed). In some examples, a determination to overwrite the portion of the memory array may be associated with a type of information stored at, or to be written to the portion of the memory array, or a configuration associated with the portion of the array itself (e.g., an indication of enabling overwriting for the portion of the memory array). For example, if the portion of the memory array is associated with or configured for relatively transient data (e.g., write boost information, parity information, L2P address information), the memory system controller 115-*a* may make a determination to overwrite information that had been stored at the portion of the memory array but had not been erased (e.g., rather than performing an erase operation and writing the portion of the memory array with relatively intransient data). In some examples, the memory system controller 115-*a* may determine that the portion of the memory array is available to be overwritten (e.g., has an available demarcation configuration 401). In some examples, the operations of 630 may be omitted, such as when determinations of whether to overwrite a portion of a memory array are made at the memory device 130-*c* (e.g., in response to receiving write operation signaling).

At 635, the memory system controller 115-*a* may transmit write operation signaling (e.g., signaling to write second information to the portion of a memory array of the memory device 130-*c*) to the memory device 130-*c*. The write operation signaling of 635 may be associated with an overwriting with second information in accordance with a second demarcation configuration 401. Accordingly, writing the second information may be associated with a second set of write signaling or values of a cell characteristic 420 (e.g., voltage, current, resistance) associated with written logic states. In some examples, the write operation signaling of 635 may include the second information and an indication to write at a portion of the memory (e.g., a logical address, a physical address). In some cases (e.g., when the memory system controller 115-*a* manages overwrite states for addresses of the memory device 130-*a*), the write operation signaling of 635 may indicate a demarcation configuration 401, or a demarcation 410 thereof, or a quantity of overwrites associated with (e.g., performed on) the portion of a memory array (e.g., as a prefix of the write operation signaling associated with a write configuration for writing the second information, an algorithm qualifier prefix). The write operation signaling of 635 may be responsive to a write command received from a host system 105, or may be associated with memory management operations, such as wear leveling or garbage collection, which may be managed by the memory system controller 115-*a*, among other examples. In some examples, the transmission of write operation signaling of 635 may be an example of, or at least a portion of, the memory system controller 115-*a* performing write operations in accordance with an overwrite demarcation configuration 401.

In some examples, at 640, the memory device 130-*c* may determine a demarcation (e.g., a voltage demarcation, a demarcation 410, a demarcation configuration 401, a second demarcation) for writing the second information. In some examples, a determined demarcation may be associated with a same quantity of logic states as the first information was written with (e.g., maintaining an SLC operation or some other multiple-level cell operation), but may be associated with different write signal magnitudes, or a different quantity of demarcations 410, among other differences. In some cases, the memory device 130-*c* may determine the demarcation for writing the second information based on an indication of the write operation signaling of 635. In some examples, the memory device 130-*c* may determine the demarcation for writing the second information based on an indication of an overwrite state or a quantity of overwrites performed on the portion of the memory array, as stored at the memory device 130-*c*.

At 645, the memory device 130-*c* may perform the write operations to store the second information (e.g., based on the write operation signaling of 635), which may be performed in accordance with a demarcation determined by the memory device 130-*c* at 640. The write operations performed at 645 may be associated with a different demarcation configuration 401 than the write operations performed at 625. For example, the demarcation configuration 401 associated with the write operations of 645 may have different write signaling, such as a different voltage or current for writing a given logic state, or a different quantity of write signals that may correspond to a given logic state. In some examples, the write operations of 645 may be associated with a demarcation 410 having a different value of a cell characteristic 420 for distinguishing between one logic state and another (e.g., a different reference voltage), or a different quantity of logic state distributions 415 or demarcations 410. However, in some examples, the write operations of 645 and the write operations of 625 may be associated with writing in accordance with a same quantity of logic states (e.g., a same quantity of two or more possible logic states). In some examples, the write operations of 645 may be performed without performing an erase operation after the write operations of 625. In some cases, after performing the second write operation, the memory device 130-*c* may store an indication that the portion of memory has been written to in accordance with the second demarcation configuration.

In some examples, the write operations of 645 may be associated with an evaluation of states stored at respective memory cells (e.g., in accordance with one or more aspects of the overwrite scheme 500). For example, the write operations of 645 may include determining a logic state to be stored at a memory cell and determining whether a state stored at the memory cell corresponds to the logic state to be stored at the memory cell. In some examples, such techniques may include performing a read or other sensing operation on the memory cell, with one or more reference voltages or other thresholds that may be the same as or different than those used in typical read operations, and determining whether a logic state associated with performing the read operation corresponds to the logic state to be stored at the memory cell. In some examples, such a determination may be used to select either a preserve operation 510 or a flip operation 515, among other selections. In various examples, such techniques may include updating a validity indication (e.g., identifying the portion of the memory array as having valid data) irrespective of whether a write signal was applied to a various memory cells, and may be associated with a different quantity of demarcations 410 or logic state distributions 415 than the demarcation configuration 401 associated with the writing of the first information at 625).

Figure 6B:
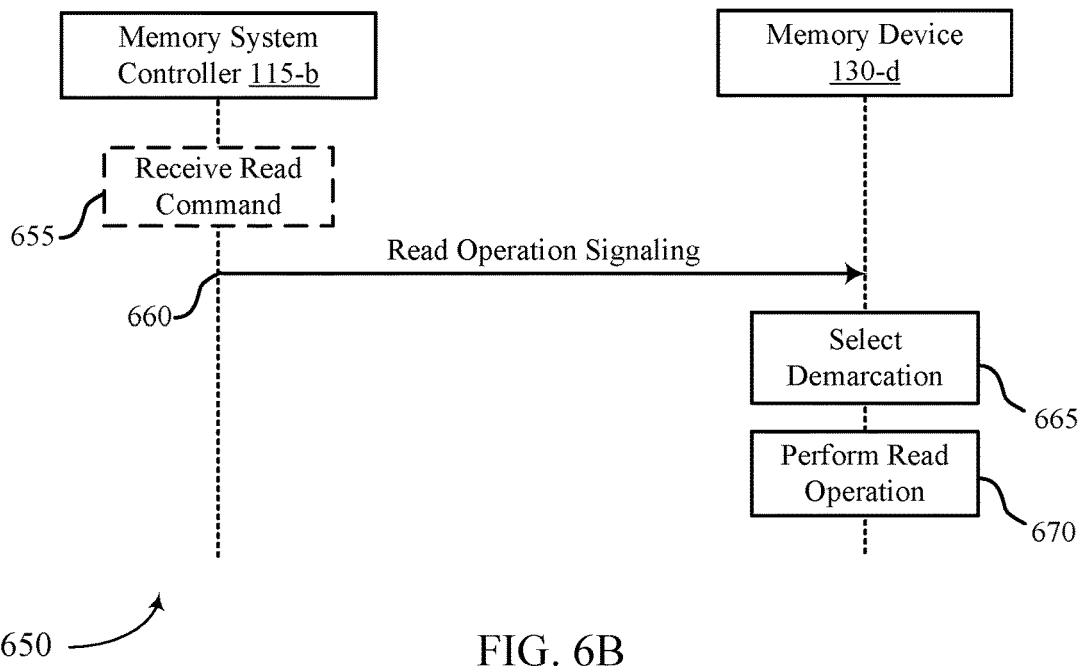

FIG. 6B illustrates an example of a process flow 650 that supports reading a portion of memory at a memory system in accordance with examples as disclosed herein. Process flow 650 may be implemented by one or more components of a memory system 110 as described with reference to FIGS. 1-3. For example, aspects of the process flow 601 may be performed by or between a memory system controller 115-b and a memory device 130-d. In some cases, process flow 650 may be implemented for reading a portion of memory that has previously been overwritten, including examples described with reference to FIGS. 4, 5, and 6A.

At 655, in some examples, the memory system controller 115-b may receive a read command (e.g., from a host system 105, from a host system controller 106). In some cases, the memory system controller 115-b may determine a read location based on an indication in the read command. A read command may be associated with a command to read a portion of a memory array of the memory device 130-d, which may have been written in accordance with a quantity of logic states (e.g., two logic states, such as a logic 0 or a logic 1, or more than two logic states, such as in an MLC configuration). In some examples, the memory system controller 115-b may not receive a read command, but may determine another condition for reading from the memory device 130-d, such as performing a memory management operation (e.g., garbage collection, wear leveling, block retirement), or another operation associated with reading information from the memory device 130-d.

At 660, the memory system controller 115-b may transmit read operation signaling to the memory device 130-d, which may be received at the memory device 130-d (e.g., at a local controller 135). The read operation signaling of 660 may include an indication to read a portion of a memory array of the memory device 130-d (e.g., associated with a read command, as identified for a memory management operation). In some examples, the memory system controller 115-b may track an overwrite condition (e.g., a quantity of write operations since a prior erase operation, how many over-programs have occurred), or a demarcation configuration 401 or demarcation 410 thereof, associated with the portion of the memory array to be read, and the read operation signaling of 660 may include an indication of the overwrite condition or demarcation configuration 401 associated with the portion of the memory array (e.g., an indication of whether the portion of the memory array was written with a quantity of logic states in accordance with one demarcation configuration 401 or another, a prefix of the read operation signaling to indicate which demarcation configuration or read levels to use for overprogrammed data, an algorithm qualifier prefix). In some other examples, the memory system controller 115-b may not track such a condition (e.g., when such a condition is tracked at the memory device 130-d), such that an indication of the condition may be omitted from the read operation signaling of 660.

At 665, the memory device 130-d may select a demarcation (e.g., a voltage demarcation, a reference voltage, a value of a demarcation 410, a quantity of demarcations 410, a quantity of levels of multi-level read circuitry). In some examples, the memory device 130-d may perform a selection among a set of demarcations based on an indication of the read operation signaling of 660 (e.g., an indication of whether the portion of the memory array was written with a quantity of logic states in accordance with one demarcation configuration 401 or another). In some other examples, the memory device 130-d may track an overwrite condition (e.g., a quantity of write operations since a prior erase operation), or a demarcation configuration 401 or demarcation 410 thereof, associated with the portion of the memory array to be read, and may select the demarcation based on an indication stored at the memory device 130-d. In some examples, such a selection may be based on a determination of a quantity of write operations performed on the portion of the memory array since a prior erase operation on the portion of the memory array, or whether the portion of the memory array was erased prior the target information being written. In some examples, such a selection may include determining whether to use one reference voltage or another for distinguishing between logic states, or determining a quantity of demarcations 410 for a given quantity of logic states, which may include a quantity of demarcations that is equal to or greater than the quantity of logic states. In some cases, the memory system controller 115-b may determine the demarcation based on the read location. For example, in some cases, the memory system controller 115-b may determine whether to perform the read according to a first demarcation or a second demarcation based on a history of write operations at the portion of memory (e.g., how many times the memory system controller 115-b has previously sent commands to write or overwrite at the portion of memory since the last erase operation).

At 670, the memory device 130-d may perform a read operation in accordance with the demarcation selected at 665. In some cases, depending on the quantity of overwrites at the portion of memory array (e.g., a quantity of overwrites performed in accordance with the overwrite scheme 400 or the overwrite scheme 500), the memory device 130-d may perform the read operation in accordance with an initial demarcation configuration 401 or an overwrite demarcation configuration, which may be associated with a single demarcation 410, or may be associated with a plurality of demarcations 410 (e.g., in accordance with N−1 read levels, where N is the number of overwrites). In some cases, such operations may involve one or more single-level read operations or sensing circuits, or may involve multi-level read operations or circuitry.

Figure 7:
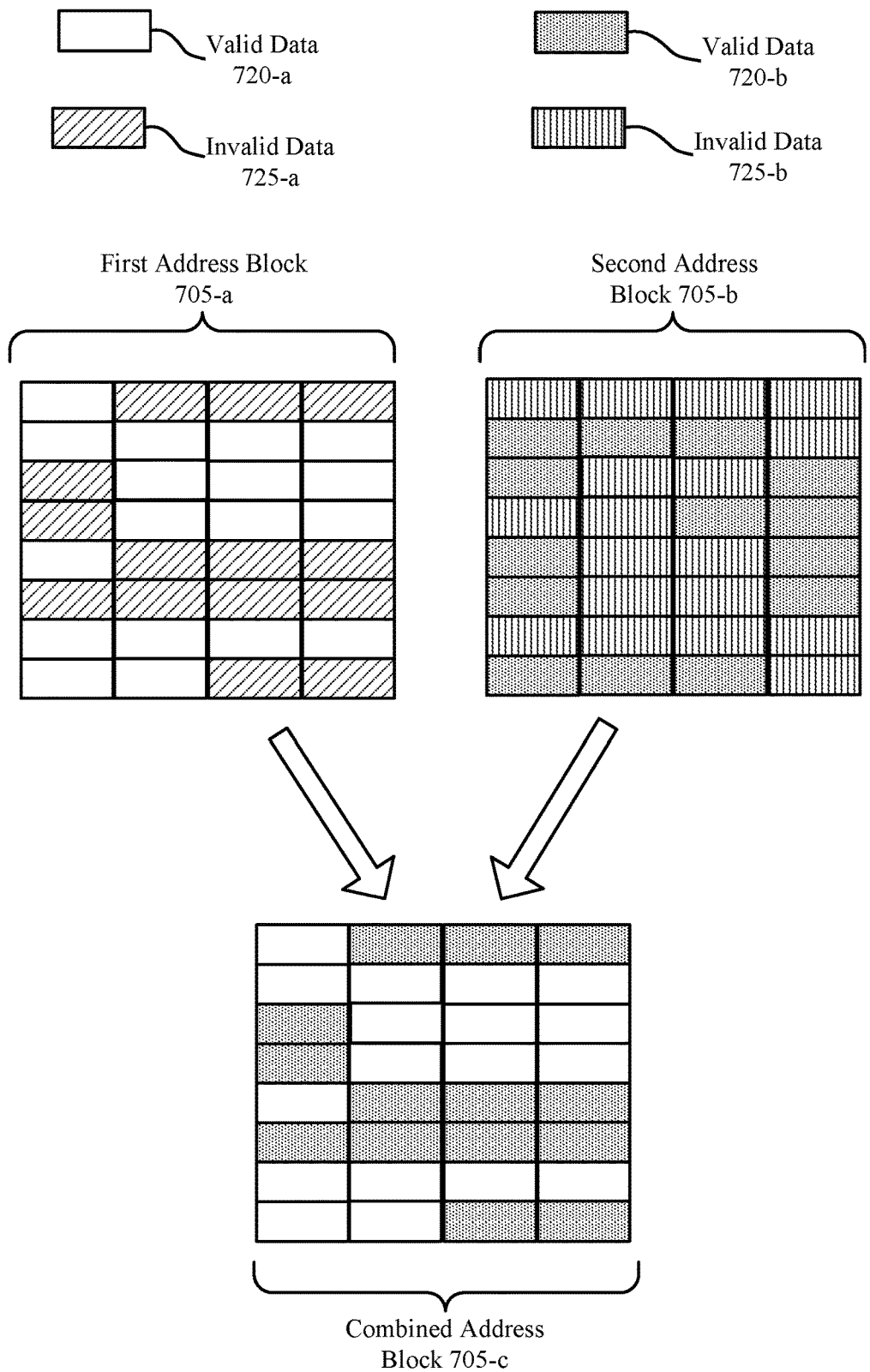
FIG. 7 illustrates an example of an overwrite mapping that supports overwriting at a memory system in accordance with examples as disclosed herein.

FIG. 7 illustrates an example of an overwrite mapping 700 that supports overwriting at a memory system in accordance with examples as disclosed herein. The overwrite mapping 700 may include a first address block 705-a, a second address block 705-b, and a combined address block 705-c, which may refer to groups of logical or physical addresses of a memory device 130. In some examples, each of the address blocks 705 may be an example of a block 360 as described with reference to FIG. 3.

In the example of overwrite mapping 700, each address block 705 may refer to a portion of a memory array (e.g., a set of memory cells 305) that has been written with data, which may include a writing in accordance with an overwrite scheme (e.g., in accordance with one or more aspects of the overwrite schemes 400 or 500). For example, the first address block 705-*a* may include valid data 720-*a* and invalid data 725-*a*, and the second address block 705-*b* may include valid data 720-*b* and invalid data 725-*b*. In some examples, invalid data 725 may be data that is outdated (e.g., due to a more recent or updated version of the data being stored at a different location, or the data being no longer needed). In some examples, valid data 720 may be a most recent version of the data stored at the memory device 130. In some cases, data written to an address block 705 may include an indication of whether it is valid data 720 (e.g., a write timestamp). In some cases, different sub-portions of data at the first address block 705 may become invalid at varying times, which may lead to a patchwork of valid data 720 and invalid data 725.

In some cases, to enable re-using portions of memory, a memory system 110 or a memory device 130 may perform a garbage collection to consolidate valid data 720 at one address block 705, which may free up another address block 705 for erasing and writing new data. For example, to make the first address block 705-*a* available for new information, valid data 720-*a* may be read and written to another location, such that the entire first address block 705-*a* may be erased (e.g., in accordance with an erase granularity). In some examples, a memory system 110 may append valid data 720 from one address block 705 to the end of another address block 705 having available locations that have not been written to since an erase operation. However, in some examples, such movement of information and subsequent erasing may be associated with information transfer latency, power consumption, biasing, or other operation of associated memory cells that may degrade the memory cells or otherwise lead to degraded performance. In some examples, implementing one or more aspects of an overwrite scheme for such memory management techniques may improve memory utilization or efficiency, reduce power consumption, or reduce degradation of a memory device 130.

For example, to consolidate the valid data 720-*a* and the valid data 720-*b*, one or more components of a memory system 110 may implement aspects of the overwrite scheme 400 or the overwrite scheme 500 to directly overwrite invalid data 725. In various examples, such techniques may include moving the valid data 720-*a* to the second address block 705-*b* (e.g., to addresses associated with invalid data 725-*b*), or moving the valid data 720-*b* to the first address block 705-*a* (e.g., to addresses associated with invalid data 725-*a*). In some cases, to support an evaluation between these and other alternatives, a memory system 110 may compare a ratio of valid data 720 and invalid data 725 for one or more address blocks 705, or a valid address count (VAC), which may be associated with a selection of a target address block 705 for reading valid data 720 to be relocated (e.g., to open an address block 705 for erasing), or a selection of a target address block 705 for writing the valid data 720 to be relocated, or both. In some examples, such evaluations may include a determination of an overwrite condition of an address block 705 (e.g., whether a portion of an address block 705 has been overwritten, whether a portion of an address block 705 is available for further overwrites), or a wear leveling condition of an address block 705 (e.g., a total quantity of accesses or other indication of degradation or available life), among other considerations. In some cases, a memory system 110 may perform such comparisons as an iterative process, to perform a number of overwrites at address blocks with the most valid data. For example In the example shown, the first address block 705-*a* may be associated with a greater quantity or proportion of valid data 720 (e.g., a quantity of valid data 720-*a* being greater than a quantity of valid data 720-*b*, a ratio of valid data 720-*a* to invalid data 725-*a* being greater than a ratio of valid data 720-*b* to invalid data 725-*b*). Accordingly, assuming such overwrites are available or otherwise supported, it may be more efficient (e.g., use fewer access operations, use less system resources) to read the valid data 720-*b* from the second address block 705-*b* (e.g., in accordance with the process flow 650, in accordance with one or more aspects of the overwrite schemes 400 or 500), and write the valid data 720-*b* to addresses associated with the invalid data 725-*a* (e.g., in accordance with the process flow 600, in accordance with one or more aspects of the overwrite schemes 400 or 500). In such an example, the combined address block 705-*c* may be associated with the same physical addresses of a memory array as the first address block 705-*a* and, after such a transfer, the physical addresses associated with the second address block 705-*b* may be available to be erased, or to be overwritten as a whole in accordance with one or more aspects of the overwrite schemes 400 or 500. For example, after relocating the valid data 720-*b*, the physical addresses associated with the second address block 705-*b* may be erased in accordance with an erase operation, which may be associated with resetting corresponding validity indications and overwrite condition indications. By implementing such techniques, garbage collection may be simplified or impose less memory degradation (e.g., by removing the step of erasing the invalid data 725-*a* or the first address block 705-*a* as a whole), or memory utilization may be improved (e.g., by overwriting rather than appending data), among other benefits. In some examples, the information moved from the second address block 705-*b* may be associated with a different identifier (e.g., prefix, overwrite identifier), such as assigning valid data 720-*b* in the combined address block 705-*c* with an logical block address (LBA) "B" identifier (e.g., in accordance with an overwrite demarcation configuration 401), whereas valid data 720-*a* may assigned with an LBA "A" in the combined address block 705-*c* (e.g., in accordance with an initial demarcation configuration 401, which may be associated with a lack of update to an address or mapping for such data that stays in place).

Although certain aspects of the overwrite mapping 700 are described in the context of garbage collection operations, the overwrite mapping 700 illustrates benefits of the described techniques for overwriting that may be implemented in other memory management operations, or more generally to any write operations. For example, because addresses associated with invalid data 725 may still be available for overwriting, an empty block 170, or portion thereof, may not be required for writing new information. Thus, available space in a memory device 130 may not be limited to those cells that have been erased, or never programmed, which may improve an availability of the memory device 130 for storing new information. In some examples, such an increase in availability may be one example for reducing an amount of overprovisioning implemented at a memory device 130 (e.g., to support a given flexibility for relocating information or erasing blocks 170), and may increase an availability for such transient information as L2P tables, write booster buffers, parity information, and others. Moreover, by reducing a quantity of erase operations, or implementing write operations with reduced write signal magnitudes, or both, memory cells may incur less stress, fatigue, or other degradation, and accordingly may support a greater TBW rating, or a greater program/erase endurance rating, among other benefits. In some examples, the relatively longer operating life of memory cells may reduce a degree of block retirement, which may be another example for reducing an amount of overprovisioning implemented at a memory device 130 (e.g., to support a given design life).

Figure 8:
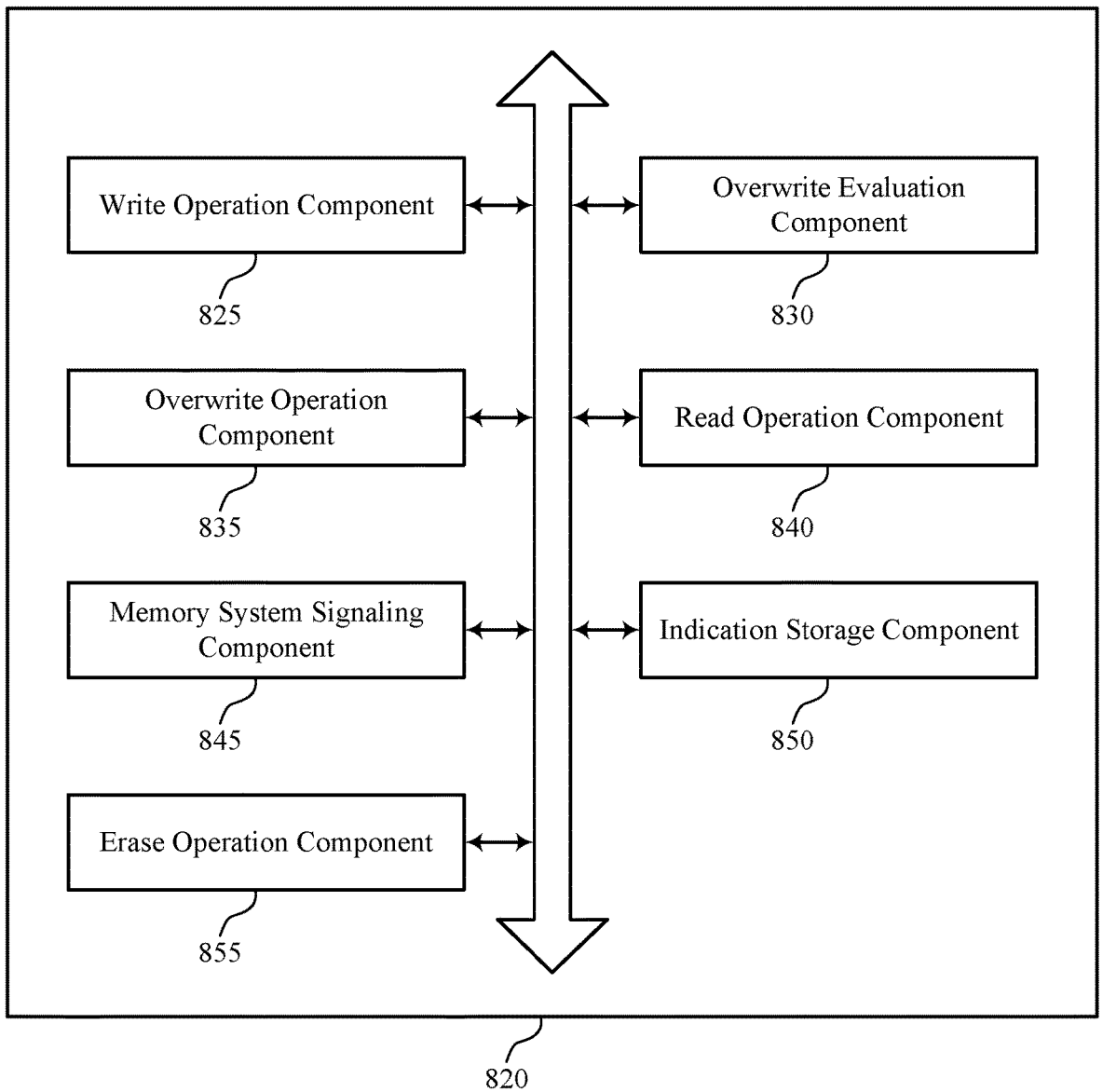
FIG. 8 illustrates a block diagram of a memory system that supports overwriting at a memory system in accordance with examples as disclosed herein.

FIG. 8 shows a block diagram 800 of a memory system 820 that supports overwriting at a memory system in accordance with examples as disclosed herein. The memory system 820 may be an example of aspects of a memory system as described with reference to FIGS. 1 through 7. The memory system 820, or various components thereof, may be an example of means for performing various aspects of overwriting at a memory system as described herein. For example, the memory system 820 may include a write operation component 825, an overwrite evaluation component 830, an overwrite operation component 835, a read operation component 840, a memory system signaling component 845, an indication storage component 850, an erase operation component 855, or any combination thereof. Each of these components may communicate, directly or indirectly, with one another (e.g., via one or more buses).

The write operation component 825 may be configured as or otherwise support a means for performing write operations in accordance with a first voltage demarcation between logic states to store first information at a portion of a memory array. The overwrite evaluation component 830 may be configured as or otherwise support a means for determining to overwrite the portion of the memory array with second information. The overwrite operation component 835 may be configured as or otherwise support a means for performing write operations in accordance with a second voltage demarcation between the logic states, based at least in part on determining to overwrite the portion of the memory array, to store the second information at the portion of the memory array.

In some examples, the write operations in accordance with the second voltage demarcation between the logic states may be performed without performing an erase operation on the portion of the memory array after performing the write operations in accordance with the first voltage demarcation between logic states.

In some examples, the first voltage demarcation between logic states may be associated with a first reference voltage for distinguishing between a first logic state and a second logic state. In some examples, the second voltage demarcation between logic states may be associated with a second reference voltage for distinguishing between the first logic state and the second logic state that is higher than the first reference voltage.

In some examples, the first voltage demarcation between logic states may be associated with a first voltage for writing a logic state. In some examples, the second voltage demarcation between logic states may be associated with a second voltage for writing the logic state that is higher than the first voltage for writing the logic state.

In some examples, the write operations in accordance with the first voltage demarcation between logic states and the write operations in accordance with the second voltage demarcation between logic states may each be associated with writing a same quantity of logic states.

In some examples, the portion of the memory array may include NAND memory cells.

In some examples, to support performing the write operations in accordance with the second voltage demarcation between logic states, the memory system signaling component 845 may be configured as or otherwise support a means for transmitting, to a memory device, signaling including the second information and an indication of the second voltage demarcation between logic states.

In some examples, the indication storage component 850 may be configured as or otherwise support a means for storing an indication that the portion of the memory array has been written to in accordance with the second voltage demarcation between logic states.

In some examples, determining to overwrite the portion of the memory array may be based at least in part on the first information, the second information, or both being associated with write boost information, parity information, or logical-to-physical address information.

In some examples, determining to overwrite the portion of the memory array may be based at least in part on a validity indication associated with the first information or the portion of the memory array.

In some examples, the overwrite evaluation component 830 may be configured as or otherwise support a means for determining a parameter associated with the portion of the memory array being enabled for overwrite operations, and determining to overwrite the portion of the memory array may be based at least in part on the determined parameter.

In some examples, the overwrite evaluation component 830 may be configured as or otherwise support a means for determining the portion of the memory array based at least in part on a proportion of the portion of the memory array that is associated with valid data.

In some examples, the overwrite evaluation component 830 may be configured as or otherwise support a means for determining a second portion of the memory array based at least in part on a proportion of the second portion of the memory array that is associated with valid data. In some examples, the read operation component 840 may be configured as or otherwise support a means for reading the second information from the determined second portion of the memory array. In some examples, the erase operation component 855 may be configured as or otherwise support a means for performing an erase operation on the second portion of the memory array after writing the second information to the portion of the memory array.

The read operation component 840 may be configured as or otherwise support a means for receiving, from a host device, a read command to read a portion of a memory array of a memory device written with a quantity of logic states. In some examples, the overwrite evaluation component 830 may be configured as or otherwise support a means for determining whether the portion of the memory array was written with the quantity of logic states in accordance with a first voltage demarcation between logic states or in accordance with a second voltage demarcation between the logic states. The memory system signaling component 845 may be configured as or otherwise support a means for transmitting signaling to the memory device to read the portion of the memory array, where the signaling may include an indication of the portion of the memory array and an indication of whether the portion of the memory array was written with the quantity of logic states in accordance with the first voltage demarcation between the logic states or in accordance with the second voltage demarcation between the logic states.

In some examples, to support determining whether the portion of the memory array was written with the quantity of logic states in accordance with the first voltage demarcation between the logic states or in accordance with the second voltage demarcation between the logic states, the overwrite evaluation component 830 may be configured as or otherwise support a means for determining a quantity of write operations performed on the portion of the memory array since a prior erase operation on the portion of the memory array.

Figure 9:
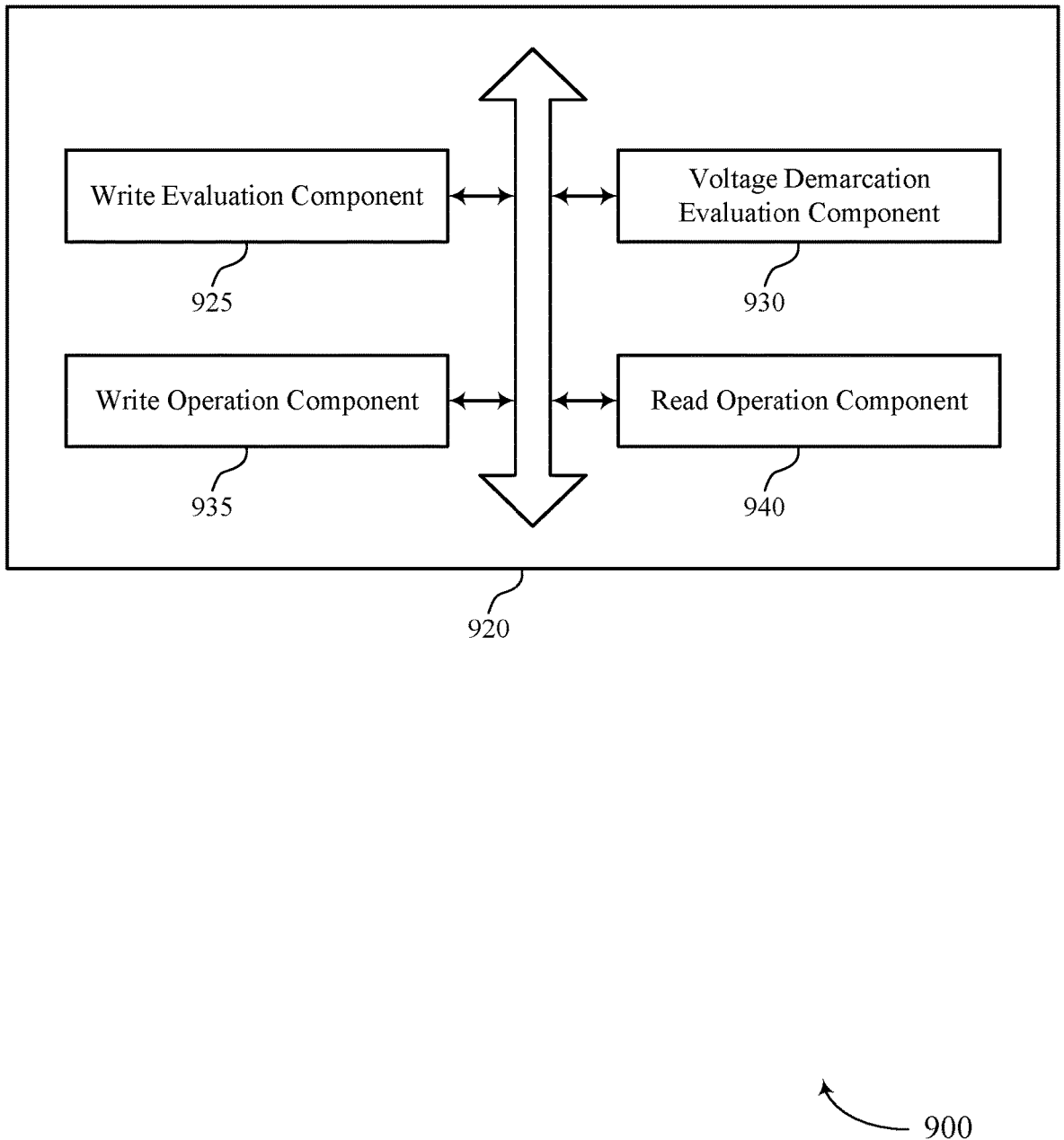
FIG. 9 shows a block diagram of a memory device that supports overwriting at a memory system in accordance with examples as disclosed herein.

FIG. 9 shows a block diagram 900 of a memory device 920 that supports overwriting at a memory system in accordance with examples as disclosed herein. The memory device 920 may be an example of aspects of a memory device as described with reference to FIGS. 1 through 7. The memory device 920, or various components thereof, may be an example of means for performing various aspects of overwriting at a memory system as described herein. For example, the memory device 920 may include a write evaluation component 925, a voltage demarcation evaluation component 930, a write operation component 935, a read operation component 940, or any combination thereof. Each of these components may communicate, directly or indirectly, with one another (e.g., via one or more buses).

The write evaluation component 925 may be configured as or otherwise support a means for receiving signaling to write first information to a portion of a memory array. The voltage demarcation evaluation component 930 may be configured as or otherwise support a means for determining a first voltage demarcation for writing a quantity of logic states to the portion of the memory array based at least in part on the portion of the memory array being written with second information in accordance with a second voltage demarcation for writing the quantity of logic states. The write operation component 935 may be configured as or otherwise support a means for writing the first information to the portion of the memory array in accordance with the determined first voltage demarcation for writing the quantity of logic states.

In some examples, writing the first information to the portion of the memory array may be performed without performing an erase operation on the portion of the memory array after the portion of the memory array being written with the second information.

In some examples, the write evaluation component 925 may be configured as or otherwise support a means for determining that the portion of the memory array was written with the second information in accordance with the second voltage demarcation based at least in part on an indication associated with the command, and determining the first voltage demarcation for writing the quantity of logic states may be based at least in part on the indication associated with the command.

In some examples, the write evaluation component 925 may be configured as or otherwise support a means for determining that the portion of the memory array was written with the second information in accordance with the second voltage demarcation based at least in part on an indication stored at the memory device and associated with the portion of the memory array, and determining the first voltage demarcation for writing the quantity of logic states may be based at least in part on the indication stored at the memory device.

In some examples, to support determining the first voltage demarcation for writing logic states, the voltage demarcation evaluation component 930 may be configured as or otherwise support a means for determining a first voltage for writing a logic state to the portion of the memory array, where the first voltage is different than a second voltage for writing the logic state that is associated with the second voltage demarcation for writing logic states.

The read operation component 940 may be configured as or otherwise support a means for receiving, from a controller of a memory system, signaling to read information from a portion of a memory array of the memory device that was written with a quantity of logic states. In some examples, the voltage demarcation evaluation component 930 may be configured as or otherwise support a means for selecting, based at least in part on whether the portion of the memory array was written with the quantity of logic states in accordance with a first voltage demarcation between logic states or in accordance with a second voltage demarcation between the logic states, between a first read voltage demarcation and a second read voltage demarcation. In some examples, the read operation component 940 may be configured as or otherwise support a means for performing read operations on the portion of the memory array based at least in part on the selected first read voltage demarcation or the selected second read voltage demarcation.

In some examples, to support determining whether to perform read operations in accordance with the first voltage demarcation between the logic states or in accordance with the second voltage demarcation between the logic states, the write evaluation component 925 may be configured as or otherwise support a means for determining a quantity of write operations performed on the portion of the memory array since a prior erase operation on the portion of the memory array.

In some examples, determining whether to perform read operations in accordance with the first voltage demarcation between the logic states or in accordance with the second voltage demarcation between the logic states is based at least in part on an indication of the received signaling.

In some examples, determining whether to perform read operations in accordance with the first voltage demarcation between the logic states or in accordance with the second voltage demarcation between the logic states is based at least in part on an indication stored at the memory device and associated with the portion of the memory array.

In some examples, to support determining whether to perform read operations in accordance with the first voltage demarcation between the logic states or in accordance with the second voltage demarcation between the logic states, the voltage demarcation evaluation component 930 may be configured as or otherwise support a means for determining whether to use a first reference voltage for distinguishing between a first logic state and a second logic state or to use a second reference voltage for distinguishing between the first logic state and the second logic state.

Figure 10:
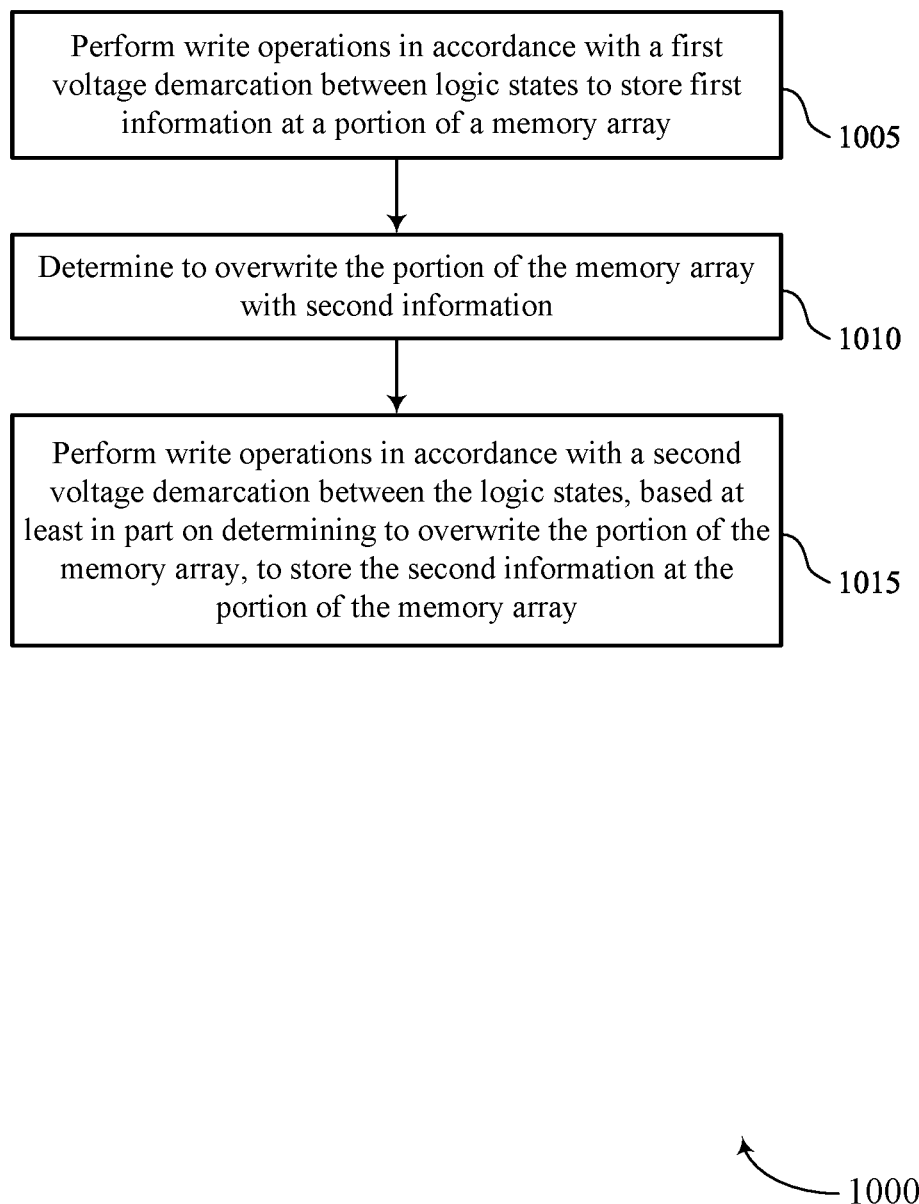
FIGS. 10 through 13 show flowcharts illustrating a method or methods that support overwriting at a memory system in accordance with examples as disclosed herein.

FIG. 10 shows a flowchart illustrating a method 1000 that supports overwriting at a memory system in accordance with examples as disclosed herein. The operations of method 1000 may be implemented by a memory system or its components as described herein. For example, the operations of method 1000 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1005, the method may include performing write operations in accordance with a first voltage demarcation between logic states to store first information at a portion of a memory array. The operations of 1005 may be performed in accordance with examples as disclosed herein. In some examples, aspects of the operations of 1005 may be performed by a write operation component 825 as described with reference to FIG. 8.

At 1010, the method may include determining to overwrite the portion of the memory array with second information. The operations of 1010 may be performed in accordance with examples as disclosed herein. In some examples, aspects of the operations of 1010 may be performed by an overwrite evaluation component 830 as described with reference to FIG. 8.

At 1015, the method may include performing write operations in accordance with a second voltage demarcation between the logic states, based at least in part on determining to overwrite the portion of the memory array, to store the second information at the portion of the memory array. The operations of 1015 may be performed in accordance with examples as disclosed herein. In some examples, aspects of the operations of 1015 may be performed by an overwrite operation component 835 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor) for performing write operations in accordance with a first voltage demarcation between logic states to store first information at a portion of a memory array, determining to overwrite the portion of the memory array with second information, and performing write operations in accordance with a second voltage demarcation between the logic states, based at least in part on determining to overwrite the portion of the memory array, to store the second information at the portion of the memory array.

In some examples of the method 1000 and the apparatus described herein, the write operations in accordance with the second voltage demarcation between the logic states may be performed without performing an erase operation on the portion of the memory array after performing the write operations in accordance with the first voltage demarcation between logic states.

In some examples of the method 1000 and the apparatus described herein, the first voltage demarcation between logic states may be associated with a first reference voltage for distinguishing between a first logic state and a second logic state and the second voltage demarcation between logic states may be associated with a second reference voltage for distinguishing between the first logic state and the second logic state that may be higher than the first reference voltage.

In some examples of the method 1000 and the apparatus described herein, the first voltage demarcation between logic states may be associated with a first voltage for writing a logic state and the second voltage demarcation between logic states may be associated with a second voltage for writing the logic state that may be higher than the first voltage for writing the logic state.

In some examples of the method 1000 and the apparatus described herein, the write operations in accordance with the first voltage demarcation between logic states and the write operations in accordance with the second voltage demarcation between logic states may be each associated with writing a same quantity of logic states.

In some examples of the method 1000 and the apparatus described herein, the portion of the memory array includes NAND memory cells.

In some examples of the method 1000 and the apparatus described herein, performing the write operations in accordance with the second voltage demarcation between logic states may include operations, features, circuitry, logic, means, or instructions for transmitting, to a memory device, signaling including the second information and an indication of the second voltage demarcation between logic states.

Some examples of the method 1000 and the apparatus described herein may further include operations, features, circuitry, logic, means, or instructions for storing an indication that the portion of the memory array may have been written to in accordance with the second voltage demarcation between logic states.

Some examples of the method 1000 and the apparatus described herein may further include operations, features, circuitry, logic, means, or instructions for determining to overwrite the portion of the memory array may be based at least in part on the first information, the second information, or both being associated with write boost information, parity information, or logical-to-physical address information.

Some examples of the method 1000 and the apparatus described herein may further include operations, features, circuitry, logic, means, or instructions for determining to overwrite the portion of the memory array may be based at least in part on a validity indication associated with the first information or the portion of the memory array.

Some examples of the method 1000 and the apparatus described herein may further include operations, features, circuitry, logic, means, or instructions for determining a parameter associated with the portion of the memory array being enabled for overwrite operations, where determining to overwrite the portion of the memory array may be based at least in part on the determined parameter.

Some examples of the method 1000 and the apparatus described herein may further include operations, features, circuitry, logic, means, or instructions for determining the portion of the memory array based at least in part on a proportion of the portion of the memory array that may be associated with valid data.

Some examples of the method 1000 and the apparatus described herein may further include operations, features, circuitry, logic, means, or instructions for determining a second portion of the memory array based at least in part on a proportion of the second portion of the memory array that may be associated with valid data, reading the second information from the determined second portion of the memory array, and performing an erase operation on the second portion of the memory array after writing the second information to the portion of the memory array.

Figure 11:
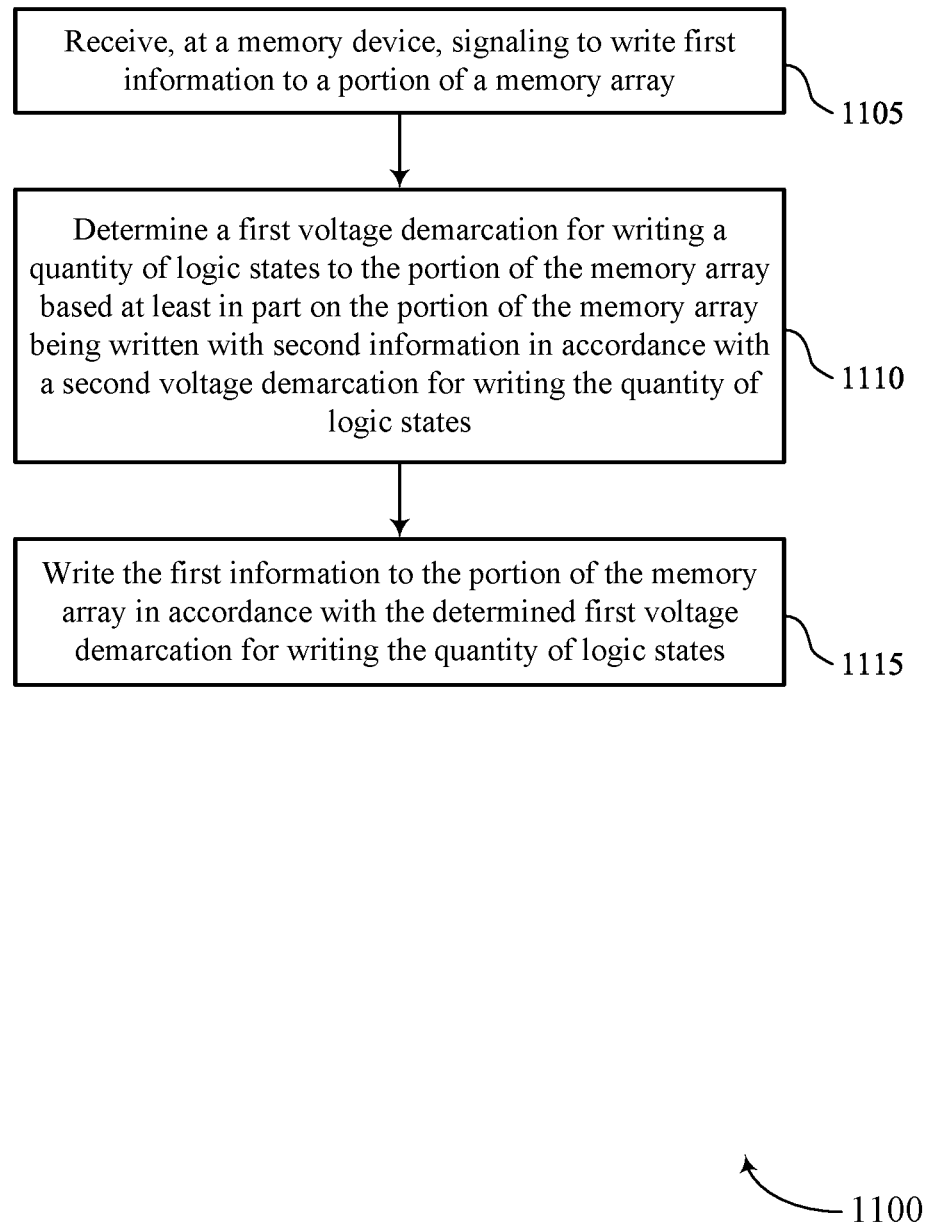

FIG. 11 shows a flowchart illustrating a method 1100 that supports overwriting at a memory system in accordance with examples as disclosed herein. The operations of method 1100 may be implemented by a memory device or its components as described herein. For example, the operations of method 1100 may be performed by a memory device as described with reference to FIGS. 1 through 7 and 9. In some examples, a memory device may execute a set of instructions to control the functional elements of the device to perform the described functions. Additionally or alternatively, the memory device may perform aspects of the described functions using special-purpose hardware.

At 1105, the method may include receiving, at a memory device, signaling to write first information to a portion of a memory array. The operations of 1105 may be performed in accordance with examples as disclosed herein. In some examples, aspects of the operations of 1105 may be performed by a write evaluation component 925 as described with reference to FIG. 9.

At 1110, the method may include determining a first voltage demarcation for writing a quantity of logic states to the portion of the memory array based at least in part on the portion of the memory array being written with second information in accordance with a second voltage demarcation for writing the quantity of logic states. The operations of 1110 may be performed in accordance with examples as disclosed herein. In some examples, aspects of the operations of 1110 may be performed by a voltage demarcation evaluation component 930 as described with reference to FIG. 9.

At 1115, the method may include writing the first information to the portion of the memory array in accordance with the determined first voltage demarcation for writing the quantity of logic states. The operations of 1115 may be performed in accordance with examples as disclosed herein. In some examples, aspects of the operations of 1115 may be performed by a write operation component 935 as described with reference to FIG. 9.

In some examples, an apparatus as described herein may perform a method or methods, such as the method 1100. The apparatus may include, features, circuitry, logic, means, or instructions (e.g., a non-transitory computer-readable medium storing instructions executable by a processor) for receiving, at a memory device, signaling to write first information to a portion of a memory array, determining a first voltage demarcation for writing a quantity of logic states to the portion of the memory array based at least in part on the portion of the memory array being written with second information in accordance with a second voltage demarcation for writing the quantity of logic states, and writing the first information to the portion of the memory array in accordance with the determined first voltage demarcation for writing the quantity of logic states.

Some examples of the method 1100 and the apparatus described herein may further include operations, features, circuitry, logic, means, or instructions for writing the first information to the portion of the memory array may be performed without performing an erase operation on the portion of the memory array after the portion of the memory array being written with the second information.

Some examples of the method 1100 and the apparatus described herein may further include operations, features, circuitry, logic, means, or instructions for determining that the portion of the memory array was written with the second information in accordance with the second voltage demarcation based at least in part on an indication associated with the command, where determining the first voltage demarcation for writing the quantity of logic states may be based at least in part on the indication associated with the command.

Some examples of the method 1100 and the apparatus described herein may further include operations, features, circuitry, logic, means, or instructions for determining that the portion of the memory array was written with the second information in accordance with the second voltage demarcation based at least in part on an indication stored at the memory device and associated with the portion of the memory array, where determining the first voltage demarcation for writing the quantity of logic states may be based at least in part on the indication stored at the memory device.

In some examples of the method 1100 and the apparatus described herein, determining the first voltage demarcation for writing logic states may include operations, features, circuitry, logic, means, or instructions for determining a first voltage for writing a logic state to the portion of the memory array, where the first voltage may be different than a second voltage for writing the logic state that may be associated with the second voltage demarcation for writing logic states.

Figure 12:
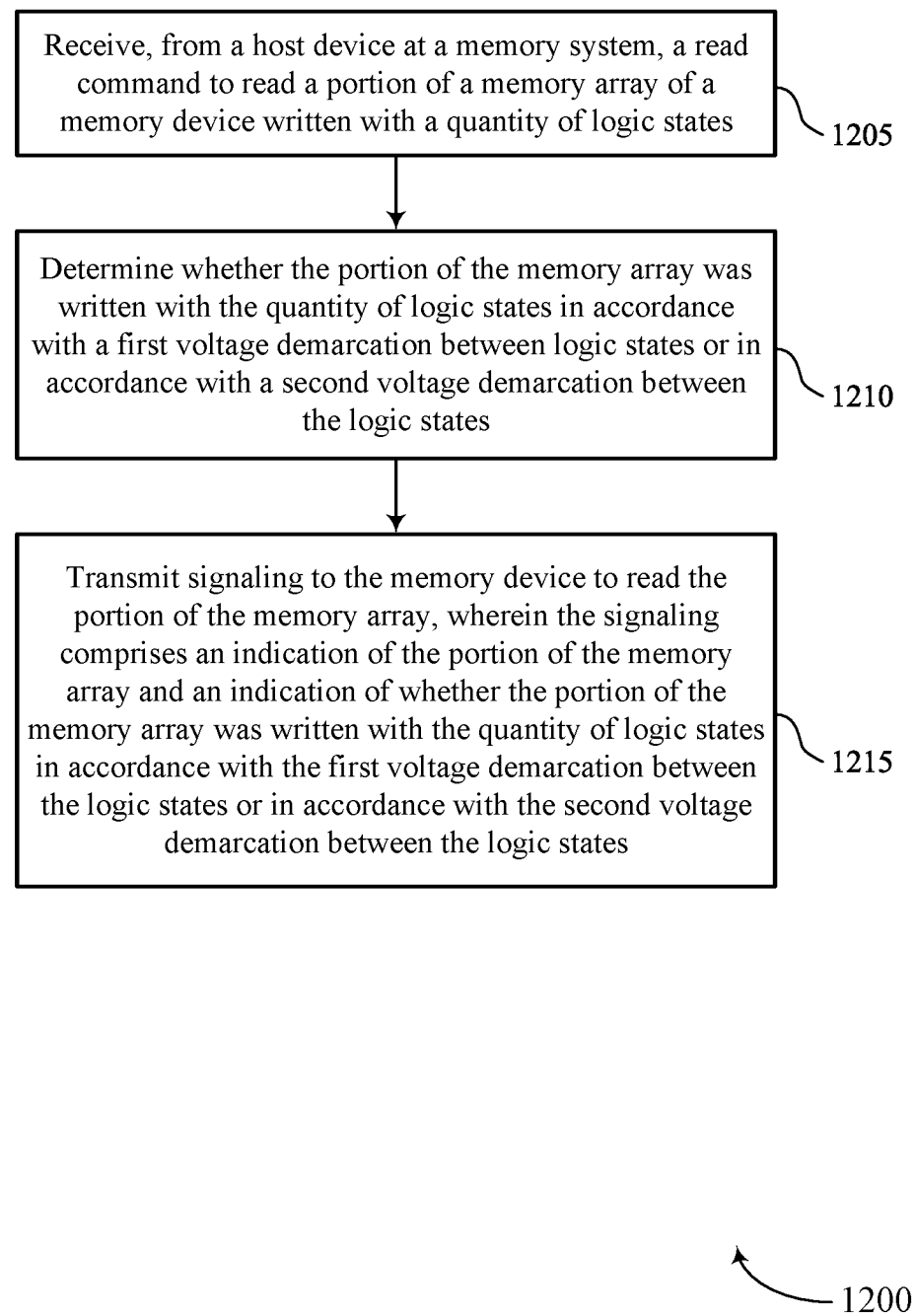

FIG. 12 shows a flowchart illustrating a method 1200 that supports overwriting at a memory system in accordance with examples as disclosed herein. The operations of method 1200 may be implemented by a memory system or its components as described herein. For example, the operations of method 1200 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1205, the method may include receiving, from a host device at a memory system, a read command to read a portion of a memory array of a memory device written with a quantity of logic states. The operations of 1205 may be performed in accordance with examples as disclosed herein. In some examples, aspects of the operations of 1205 may be performed by a read operation component 840 as described with reference to FIG. 8.

At 1210, the method may include determining whether the portion of the memory array was written with the quantity of logic states in accordance with a first voltage demarcation between logic states or in accordance with a second voltage demarcation between the logic states. The operations of 1210 may be performed in accordance with examples as disclosed herein. In some examples, aspects of the operations of 1210 may be performed by an overwrite evaluation component 830 as described with reference to FIG. 8.

At 1215, the method may include transmitting signaling to the memory device to read the portion of the memory array, where the signaling includes an indication of the portion of the memory array and an indication of whether the portion of the memory array was written with the quantity of logic states in accordance with the first voltage demarcation between the logic states or in accordance with the second voltage demarcation between the logic states. The operations of 1215 may be performed in accordance with examples as disclosed herein. In some examples, aspects of the operations of 1215 may be performed by a memory system signaling component 845 as described with reference to FIG. 8.

In some examples, an apparatus as described herein may perform a method or methods, such as the method 1200. The apparatus may include, features, circuitry, logic, means, or instructions (e.g., a non-transitory computer-readable medium storing instructions executable by a processor) for receiving, from a host device at a memory system, a read command to read a portion of a memory array of a memory device written with a quantity of logic states, determining whether the portion of the memory array was written with the quantity of logic states in accordance with a first voltage demarcation between logic states or in accordance with a second voltage demarcation between the logic states, and transmitting signaling to the memory device to read the portion of the memory array, where the signaling includes an indication of the portion of the memory array and an indication of whether the portion of the memory array was written with the quantity of logic states in accordance with the first voltage demarcation between the logic states or in accordance with the second voltage demarcation between the logic states.

In some examples of the method 1200 and the apparatus described herein, determining whether the portion of the memory array was written with the quantity of logic states in accordance with the first voltage demarcation between logic states or in accordance with the second voltage demarcation between the logic states may include operations, features, circuitry, logic, means, or instructions for determining a quantity of write operations performed on the portion of the memory array since a prior erase operation on the portion of the memory array.

Figure 13:
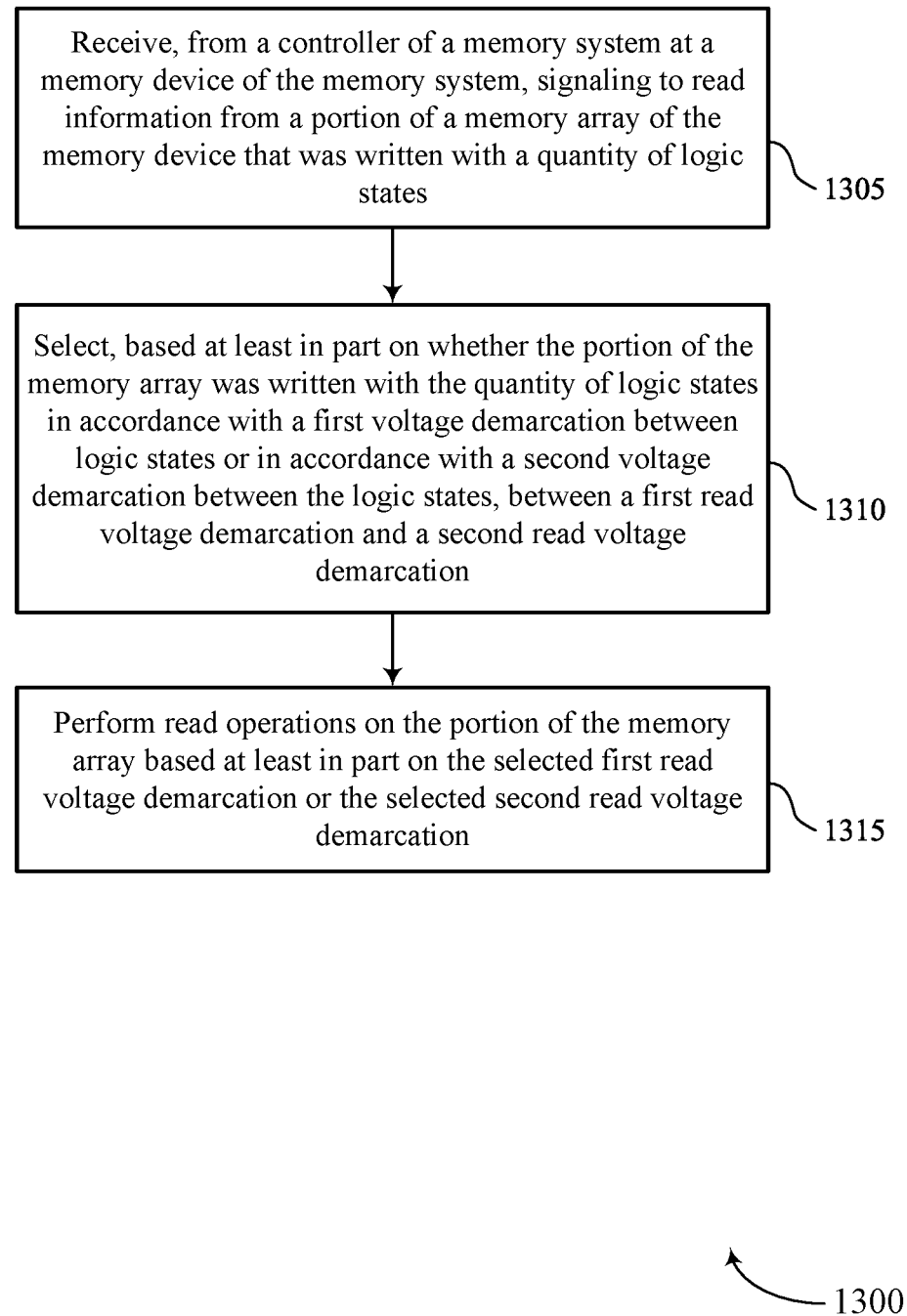

FIG. 13 shows a flowchart illustrating a method 1300 that supports overwriting at a memory system in accordance with examples as disclosed herein. The operations of method 1300 may be implemented by a memory device or its components as described herein. For example, the operations of method 1300 may be performed by a memory device as described with reference to FIGS. 1 through 7 and 9. In some examples, a memory device may execute a set of instructions to control the functional elements of the device to perform the described functions. Additionally or alternatively, the memory device may perform aspects of the described functions using special-purpose hardware.

At 1305, the method may include receiving, from a controller of a memory system at a memory device of the memory system, signaling to read information from a portion of a memory array of the memory device that was written with a quantity of logic states. The operations of 1305 may be performed in accordance with examples as disclosed herein. In some examples, aspects of the operations of 1305 may be performed by a read operation component 940 as described with reference to FIG. 9.

At 1310, the method may include selecting, based at least in part on whether the portion of the memory array was written with the quantity of logic states in accordance with a first voltage demarcation between logic states or in accordance with a second voltage demarcation between the logic states, between a first read voltage demarcation and a second read voltage demarcation. The operations of 1310 may be performed in accordance with examples as disclosed herein. In some examples, aspects of the operations of 1310 may be performed by a voltage demarcation evaluation component 930 as described with reference to FIG. 9.

At 1315, the method may include performing read operations on the portion of the memory array based at least in part on the selected first read voltage demarcation or the selected second read voltage demarcation. The operations of 1315 may be performed in accordance with examples as disclosed herein. In some examples, aspects of the operations of 1315 may be performed by a read operation component 940 as described with reference to FIG. 9.

In some examples, an apparatus as described herein may perform a method or methods, such as the method 1300. The apparatus may include, features, circuitry, logic, means, or instructions (e.g., a non-transitory computer-readable medium storing instructions executable by a processor) for receiving, from a controller of a memory system at a memory device of the memory system, signaling to read information from a portion of a memory array of the memory device that was written with a quantity of logic states, selecting, based at least in part on whether the portion of the memory array was written with the quantity of logic states in accordance with a first voltage demarcation between logic states or in accordance with a second voltage demarcation between the logic states, between a first read voltage demarcation and a second read voltage demarcation, and performing read operations on the portion of the memory array based at least in part on the selected first read voltage demarcation or the selected second read voltage demarcation.

In some examples of the method 1300 and the apparatus described herein, determining whether to perform read operations in accordance with the first voltage demarcation between the logic states or in accordance with the second voltage demarcation between the logic states may include operations, features, circuitry, logic, means, or instructions for determining a quantity of write operations performed on the portion of the memory array since a prior erase operation on the portion of the memory array.

Some examples of the method 1300 and the apparatus described herein may further include operations, features, circuitry, logic, means, or instructions for determining whether to perform read operations in accordance with the first voltage demarcation between the logic states or in accordance with the second voltage demarcation between the logic states may be based at least in part on an indication of the received signaling.

Some examples of the method 1300 and the apparatus described herein may further include operations, features, circuitry, logic, means, or instructions for determining whether to perform read operations in accordance with the first voltage demarcation between the logic states or in accordance with the second voltage demarcation between the logic states may be based at least in part on an indication stored at the memory device and associated with the portion of the memory array.

In some examples of the method 1300 and the apparatus described herein, determining whether to perform read operations in accordance with the first voltage demarcation between the logic states or in accordance with the second voltage demarcation between the logic states may include operations, features, circuitry, logic, means, or instructions for determining whether to use a first reference voltage for distinguishing between a first logic state and a second logic state or to use a second reference voltage for distinguishing between the first logic state and the second logic state.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory device including a memory array and a controller of or coupled with the memory device. The controller may be configured to cause the apparatus to perform write operations in accordance with a first voltage demarcation between logic states to store first information at a portion of the memory array, determine to overwrite the portion of the memory array with second information. and perform write operations in accordance with a second voltage demarcation between the logic states, based at least in part on determining to overwrite the portion of the memory array, to store the second information at the portion of the memory array.

In some examples of the apparatus, the write operations in accordance with the second voltage demarcation between the logic states may be performed without performing an erase operation on the portion of the memory array after performing the write operations in accordance with the first voltage demarcation between logic states.

In some examples of the apparatus, the first voltage demarcation between logic states may be associated with a first reference voltage for distinguishing between a first logic state and a second logic state, and the second voltage demarcation between logic states may be associated with a second reference voltage for distinguishing between the first logic state and the second logic state that is higher than the first reference voltage.

In some examples of the apparatus, the first voltage demarcation between logic states may be associated with a first voltage for writing a logic state, and the second voltage demarcation between logic states may be associated with a second voltage for writing the logic state that is higher than the first voltage for writing the logic state.

In some examples of the apparatus, the write operations in accordance with the first voltage demarcation between logic states and the write operations in accordance with the second voltage demarcation between logic states may each be associated with writing a same quantity of logic states.

In some examples of the apparatus, the portion of the memory array comprises NAND memory cells.

In some examples of the apparatus, to perform the write operations in accordance with the second voltage demarcation between logic states, the controller may be configured to cause the apparatus to transmit, to the memory device, signaling comprising the second information and an indication of the second voltage demarcation between logic states.

In some examples of the apparatus, the controller may be further configured to cause the apparatus to store an indication that the portion of the memory array has been written to in accordance with the second voltage demarcation between logic states.

In some examples of the apparatus, the controller may be configured to cause the apparatus to determine to overwrite the portion of the memory array based at least in part on the first information, the second information, or both being associated with write boost information, parity information, or logical-to-physical address information.

In some examples of the apparatus, the controller may configured to cause the apparatus to determine to overwrite the portion of the memory array based at least in part on a validity indication associated with the first information or the portion of the memory array.

In some examples of the apparatus, the controller may be further configured to cause the apparatus to determine a parameter associated with the portion of the memory array being enabled for overwrite operations, wherein determining to overwrite the portion of the memory array is based at least in part on the determined parameter.

In some examples of the apparatus, the controller may be further configured to cause the apparatus to determine the portion of the memory array based at least in part on a proportion of the portion of the memory array that is associated with valid data.

In some examples of the apparatus, the controller may be further configured to cause the apparatus to determine a second portion of the memory array based at least in part on a proportion of the second portion of the memory array that is associated with valid data, read the second information from the determined second portion of the memory array, and perform an erase operation on the second portion of the memory array after writing the second information to the portion of the memory array.

An apparatus is described. The apparatus may include a memory array and a controller coupled with the memory array. The controller may be configured to cause the apparatus to receive signaling to write first information to a portion of the memory array, determine a first voltage demarcation for writing a quantity of logic states to the portion of the memory array based at least in part on the portion of the memory array being written with second information in accordance with a second voltage demarcation for writing the quantity of logic states, and write the first information to the portion of the memory array in accordance with the determined first voltage demarcation for writing the quantity of logic states.

In some examples of the apparatus, the controller may be configured to cause the apparatus to write the first information to the portion of the memory array without performing an erase operation on the portion of the memory array after the portion of the memory array being written with the second information.

In some examples of the apparatus, the controller may be further configured to cause the apparatus to determine that the portion of the memory array was written with the second information in accordance with the second voltage demarcation based at least in part on an indication associated with the command, and determining the first voltage demarcation for writing the quantity of logic states may be based at least in part on the indication associated with the command.

In some examples of the apparatus, the controller may be further configured to cause the apparatus to determine that the portion of the memory array was written with the second information in accordance with the second voltage demarcation based at least in part on an indication stored at the memory device and associated with the portion of the memory array, and determining the first voltage demarcation for writing the quantity of logic states may be based at least in part on the indication stored at the memory device.

In some examples of the apparatus, to determine the first voltage demarcation for writing logic states, the controller may be configured to cause the apparatus to determine a first voltage for writing a logic state to the portion of the memory array, where the first voltage may be different than a second voltage for writing the logic state that is associated with the second voltage demarcation for writing logic states.

An apparatus is described. The apparatus may include a memory device comprising a memory array and a controller coupled with the memory device. The controller may be configured to cause the apparatus to receive, from a host device, a read command to read a portion of the memory array written with a quantity of logic states, determine whether the portion of the memory array was written with the quantity of logic states in accordance with a first voltage demarcation between logic states or in accordance with a second voltage demarcation between the logic states, and transmit signaling to the memory device to read the portion of the memory array. In some examples, the signaling may include an indication of the portion of the memory array and an indication of whether the portion of the memory array was written with the quantity of logic states in accordance with the first voltage demarcation between the logic states or in accordance with the second voltage demarcation between the logic states.

In some examples, to determine whether the portion of the memory array was written with the quantity of logic states in accordance with the first voltage demarcation between logic states or in accordance with the second voltage demarcation between the logic states, the controller may be configured to cause the apparatus to determine a quantity of write operations performed on the portion of the memory array since a prior erase operation on the portion of the memory array.

An apparatus is described. The apparatus may include a memory array and a controller coupled with the memory array. The controller may be configured to cause the apparatus to receive, from a controller of a memory system, signaling to read information from a portion of the memory array that was written with a quantity of logic states, select, based at least in part on whether the portion of the memory array was written with the quantity of logic states in accordance with a first voltage demarcation between logic states or in accordance with a second voltage demarcation between the logic states, between a first read voltage demarcation and a second read voltage demarcation, and perform read operations on the portion of the memory array based at least in part on the selected first read voltage demarcation or the selected second read voltage demarcation.

In some examples of the apparatus, to determine whether to perform read operations in accordance with the first voltage demarcation between the logic states or in accordance with the second voltage demarcation between the logic states, the controller may be configured to cause the apparatus to determine a quantity of write operations performed on the portion of the memory array since a prior erase operation on the portion of the memory array.

In some examples of the apparatus, the controller may be configured to cause the apparatus to determine whether to perform the read operations in accordance with the first voltage demarcation between the logic states or in accordance with the second voltage demarcation between the logic states based at least in part on an indication of the received signaling.

In some examples of the apparatus, the controller may be configured to cause the apparatus to determine whether to perform the read operations in accordance with the first voltage demarcation between the logic states or in accordance with the second voltage demarcation between the logic states based at least in part on an indication stored at the apparatus and associated with the portion of the memory array.

In some examples of the apparatus, to determine whether to perform read operations in accordance with the first voltage demarcation between the logic states or in accordance with the second voltage demarcation between the logic states, the controller may be configured to cause the apparatus to determine whether to use a first reference voltage for distinguishing between a first logic state and a second logic state or to use a second reference voltage for distinguishing between the first logic state and the second logic state.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device comprising a memory array; and
a controller coupled with the memory device and configured to cause the apparatus to:
perform write operations in accordance with a first voltage demarcation between logic states to store first information at a portion of the memory array;
determine to overwrite the portion of the memory array with second information; and
perform write operations in accordance with a second voltage demarcation between the logic states, different than the first voltage demarcation between the logic states, based at least in part on determining to overwrite the portion of the memory array, to store the second information at the portion of the memory array.

2. The apparatus of claim 1, wherein the write operations in accordance with the second voltage demarcation between the logic states are performed without performing an erase operation on the portion of the memory array after performing the write operations in accordance with the first voltage demarcation between logic states.

3. The apparatus of claim 1, wherein:
the first voltage demarcation between logic states is associated with a first reference voltage for distinguishing between a first logic state and a second logic state; and
the second voltage demarcation between logic states is associated with a second reference voltage for distinguishing between the first logic state and the second logic state that is higher than the first reference voltage.

4. The apparatus of claim 1, wherein:
the first voltage demarcation between logic states is associated with a first voltage for writing a logic state; and
the second voltage demarcation between logic states is associated with a second voltage for writing the logic state that is higher than the first voltage for writing the logic state.

5. The apparatus of claim 1, wherein the write operations in accordance with the first voltage demarcation between logic states and the write operations in accordance with the second voltage demarcation between logic states are each associated with writing a same quantity of logic states.

6. The apparatus of claim 1, wherein the portion of the memory array comprises NAND memory cells.

7. The apparatus of claim 1, wherein, to perform the write operations in accordance with the second voltage demarcation between logic states, the controller is configured to cause the apparatus to:
transmit, to the memory device, signaling comprising the second information and an indication of the second voltage demarcation between logic states.

8. The apparatus of claim 1, wherein the controller is further configured to cause the apparatus to:
store an indication that the portion of the memory array has been written to in accordance with the second voltage demarcation between logic states.

9. The apparatus of claim 1, wherein the controller is configured to cause the apparatus to:
determine to overwrite the portion of the memory array based at least in part on the first information, the second information, or both being associated with write boost information, parity information, or logical-to-physical address information.

10. The apparatus of claim 1, wherein the controller is configured to cause the apparatus to:
determine to overwrite the portion of the memory array based at least in part on a validity indication associated with the first information or the portion of the memory array.

11. The apparatus of claim 1, wherein the controller is further configured to cause the apparatus to:
determine a parameter associated with the portion of the memory array being enabled for overwrite operations, wherein determining to overwrite the portion of the memory array is based at least in part on the determined parameter.

12. The apparatus of claim 1, wherein the controller is further configured to cause the apparatus to:
determine the portion of the memory array based at least in part on a proportion of the portion of the memory array that is associated with valid data.

13. The apparatus of claim 12, wherein the controller is further configured to cause the apparatus to:
determine a second portion of the memory array based at least in part on a proportion of the second portion of the memory array that is associated with valid data;
read the second information from the determined second portion of the memory array; and
perform an erase operation on the second portion of the memory array after writing the second information to the portion of the memory array.

14. An apparatus, comprising:
a memory array; and
a controller coupled with the memory array and configured to cause the apparatus to:
receive signaling to write first information to a portion of the memory array;
determine a first voltage demarcation for writing a quantity of logic states to the portion of the memory array based at least in part on the portion of the memory array being written with second information in accordance with a second voltage demarcation for writing the quantity of logic states, different than the first voltage demarcation for writing the quantity of logic states; and
write the first information to the portion of the memory array in accordance with the determined first voltage demarcation for writing the quantity of logic states.

15. The apparatus of claim 14, wherein the controller is configured to cause the apparatus to:
write the first information to the portion of the memory array without performing an erase operation on the portion of the memory array after the portion of the memory array being written with the second information.

16. The apparatus of claim 14, wherein the controller is further configured to cause the apparatus to:
determine that the portion of the memory array was written with the second information in accordance with the second voltage demarcation based at least in part on an indication associated with the signaling to write the first information to the portion of the memory array, wherein determining the first voltage demarcation for writing the quantity of logic states is based at least in part on the indication associated with the signaling.

17. The apparatus of claim 14, wherein the controller is further configured to cause the apparatus to:
determine that the portion of the memory array was written with the second information in accordance with the second voltage demarcation based at least in part on an indication stored at the apparatus and associated with the portion of the memory array, wherein determining the first voltage demarcation for writing the quantity of logic states is based at least in part on the indication stored at the apparatus.

18. The apparatus of claim 14, wherein, to determine the first voltage demarcation for writing logic states, the controller is configured to cause the apparatus to:
determine a first voltage for writing a logic state to the portion of the memory array, wherein the first voltage is different than a second voltage for writing the logic state that is associated with the second voltage demarcation for writing logic states.

19. An apparatus, comprising:
a memory device comprising a memory array; and
a controller coupled with the memory device and configured to cause the apparatus to:
receive, from a host device, a read command to read a portion of the memory array written with a quantity of logic states;
determine whether the portion of the memory array was written with the quantity of logic states in accordance with a first voltage demarcation between logic states or in accordance with a second voltage demarcation between the logic states, different than the first voltage demarcation between the logic states; and
transmit signaling to the memory device to read the portion of the memory array, wherein the signaling comprises an indication of the portion of the memory array and an indication of whether the portion of the memory array was written with the quantity of logic states in accordance with the first voltage demarcation between the logic states or in accordance with the second voltage demarcation between the logic states.

20. The apparatus of claim 19, wherein, to determine whether the portion of the memory array was written with the quantity of logic states in accordance with the first voltage demarcation between logic states or in accordance with the second voltage demarcation between the logic states, the controller may be configured to cause the apparatus to:
determine a quantity of write operations performed on the portion of the memory array since a prior erase operation on the portion of the memory array.

21. An apparatus, comprising:
a memory array; and
a controller coupled with the memory array and configured to cause the apparatus to:
receive, from a controller of a memory system, signaling to read information from a portion of the memory array that was written with a quantity of logic states;
select, based at least in part on whether the portion of the memory array was written with the quantity of logic states in accordance with a first voltage demarcation between logic states or in accordance with a second voltage demarcation between the logic states different than the first voltage demarcation between the logic states, between a first read voltage demarcation and a second read voltage demarcation; and
perform read operations on the portion of the memory array based at least in part on the selected first read voltage demarcation or the selected second read voltage demarcation.

22. The apparatus of claim 21, wherein, to determine whether to perform read operations in accordance with the first voltage demarcation between the logic states or in accordance with the second voltage demarcation between the logic states, the controller is configured to cause the apparatus to:
determine a quantity of write operations performed on the portion of the memory array since a prior erase operation on the portion of the memory array.

23. The apparatus of claim 21, wherein the controller is configured to cause the apparatus to:
determine whether to perform the read operations in accordance with the first voltage demarcation between the logic states or in accordance with the second voltage demarcation between the logic states based at least in part on an indication of the received signaling.

24. The apparatus of claim 21, wherein the controller is configured to cause the apparatus to:
determine whether to perform the read operations in accordance with the first voltage demarcation between the logic states or in accordance with the second voltage demarcation between the logic states based at least in part on an indication stored at the apparatus and associated with the portion of the memory array.

25. The apparatus of claim 21, wherein, to determine whether to perform read operations in accordance with the first voltage demarcation between the logic states or in accordance with the second voltage demarcation between the logic states, the controller is configured to cause the apparatus to:
determine whether to use a first reference voltage for distinguishing between a first logic state and a second logic state or to use a second reference voltage for distinguishing between the first logic state and the second logic state.

* * * * *